(12) United States Patent
Chiriac et al.

(10) Patent No.: US 10,353,445 B2
(45) Date of Patent: Jul. 16, 2019

(54) MULTI-PHASE HEAT DISSIPATING DEVICE FOR AN ELECTRONIC DEVICE

(71) Applicant: QUALCOMM Incorporated, San Diego, CA (US)

(72) Inventors: Victor Adrian Chiriac, San Diego, CA (US); Jorge Luis Rosales, San Diego, CA (US); Stephen Arthur Molloy, Carlsbad, CA (US); Jon James Anderson, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/481,665

(22) Filed: Apr. 7, 2017

(65) Prior Publication Data

US 2017/0293329 A1  Oct. 12, 2017

Related U.S. Application Data

(63) Continuation-in-part of application No. 15/230,114, filed on Aug. 5, 2016, now abandoned.
(Continued)

(51) Int. Cl.
*G06F 1/20* (2006.01)
*H01L 23/427* (2006.01)
(Continued)

(52) U.S. Cl.
CPC ........... *G06F 1/20* (2013.01); *F28D 15/0233* (2013.01); *F28D 15/0266* (2013.01);
(Continued)

(58) Field of Classification Search
CPC ............... G06F 1/20; F28D 2020/0008; F28D 15/0266
(Continued)

(56) References Cited

U.S. PATENT DOCUMENTS 6,226,178 B1   5/2001  Broder et al.
6,674,642 B1 *  1/2004  Chu ................. G06F 1/203
                                                   165/80.4
(Continued)

FOREIGN PATENT DOCUMENTS

EP       2348271 A1     7/2011
WO   WO-2007130668 A2   11/2007
(Continued)

OTHER PUBLICATIONS

International Search Report and Written Opinion—PCT/US2017/026841—ISA/EPO—dated Jun. 26, 2017.
(Continued)

*Primary Examiner* — Mukundbhai G Patel
(74) *Attorney, Agent, or Firm* — Loza & Loza, LLP/Qualcomm

(57) ABSTRACT

A device that includes a region comprising an integrated device, and a heat dissipating device coupled to the region comprising the integrated device. The heat dissipating device is configured to dissipate heat away from the region. The heat dissipating device includes a fluid, an evaporator configured to evaporate the fluid, a condenser configured to condense the fluid, an inner wall coupled to the evaporator and the condenser, an outer shell encapsulating the fluid, the evaporator, the condenser and the inner wall, an evaporation portion configured to channel an evaporated fluid from the evaporator to the condenser, wherein the evaporation portion is at least partially defined by the inner wall, and a collection portion configured to channel a condensed fluid from the condenser to the evaporator, wherein the collection portion is at least partially defined by the inner wall. The heat dissipating device may be a multi-phase heat dissipating device.

24 Claims, 27 Drawing Sheets

PLAN VIEW

Related U.S. Application Data

(60) Provisional application No. 62/321,090, filed on Apr. 11, 2016, provisional application No. 62/433,135, filed on Dec. 12, 2016.

(51) Int. Cl.
*H01L 23/473* (2006.01)
*F28D 15/02* (2006.01)

(52) U.S. Cl.
CPC ............. *G06F 1/203* (2013.01); *G06F 1/206* (2013.01); *H01L 23/427* (2013.01); *H01L 23/473* (2013.01); *G06F 2200/201* (2013.01)

(58) Field of Classification Search
USPC .................................................... 361/679.53
See application file for complete search history.

(56) References Cited

U.S. PATENT DOCUMENTS

| | | | |
|---|---|---|---|
| 7,184,265 B2* | 2/2007 | Kim ................... | F28D 15/0233 165/104.33 |
| 7,188,484 B2* | 3/2007 | Kim ....................... | G06F 1/203 165/104.33 |
| 7,249,627 B2* | 7/2007 | Choi ................... | F28D 15/0233 165/104.21 |
| 7,486,517 B2 | 2/2009 | Aapro et al. | |
| 7,552,759 B2* | 6/2009 | Liu ....................... | F28D 15/043 126/635 |
| 8,716,689 B2 | 5/2014 | Chen et al. | |
| 8,763,681 B2* | 7/2014 | Agostini ............. | F28D 15/0266 165/104.22 |
| 9,007,769 B2 | 4/2015 | Cheng et al. | |
| 9,097,467 B2* | 8/2015 | Gradinger ............... | F28D 15/02 |
| 9,261,309 B2 | 2/2016 | Wang | |
| 9,918,407 B2 | 3/2018 | Rosales et al. | |
| 2002/0170705 A1 | 11/2002 | Cho et al. | |
| 2003/0079865 A1 | 5/2003 | Son et al. | |
| 2003/0205364 A1 | 11/2003 | Sauciuc et al. | |
| 2004/0190253 A1 | 9/2004 | Prasher et al. | |
| 2005/0051304 A1 | 3/2005 | Makino et al. | |
| 2005/0099776 A1 | 5/2005 | Xue et al. | |
| 2006/0157227 A1* | 7/2006 | Choi ....................... | B82Y 30/00 165/104.21 |
| 2007/0012427 A1 | 1/2007 | Liu et al. | |
| 2007/0068654 A1 | 3/2007 | Chang | |
| 2007/0151275 A1 | 7/2007 | Chiriac | |
| 2010/0044014 A1* | 2/2010 | Ho ........................... | F28D 1/035 165/104.26 |
| 2011/0051071 A1 | 3/2011 | Nakamichi et al. | |
| 2011/0232874 A1 | 9/2011 | Xu et al. | |
| 2011/0279978 A1 | 11/2011 | Yoshikawa et al. | |
| 2012/0111553 A1* | 5/2012 | Tsoi ..................... | F28D 15/0233 165/185 |
| 2012/0199322 A1 | 8/2012 | Frigiere et al. | |
| 2013/0270721 A1* | 10/2013 | Chiriac ............... | H01L 23/4275 257/796 |
| 2014/0246176 A1* | 9/2014 | Yang ....................... | F28F 13/00 165/104.26 |
| 2014/0352926 A1 | 12/2014 | Sun et al. | |
| 2016/0037681 A1* | 2/2016 | Lee ........................ | H04B 1/036 455/556.1 |
| 2016/0076819 A1 | 3/2016 | Espersen et al. | |
| 2017/0295671 A1 | 10/2017 | Chiriac et al. | |
| 2018/0049346 A1 | 2/2018 | Chiriac et al. | |

FOREIGN PATENT DOCUMENTS

| | | |
|---|---|---|
| WO | WO-2012161002 A1 | 11/2012 |
| WO | WO-2015142669 A1 | 9/2015 |
| WO | WO-2015154044 A1 | 10/2015 |

OTHER PUBLICATIONS

Hong Y., et al., "Tuning Thermal Contact Conductance at Graphene—Copper Interface via Surface Nanoengineering", Nanoscale, The Royal Society of Chemistry, 2015, pp. 6286-6294.

* cited by examiner

THERMALLY CONDUCTIVE ELEMENT
CONFIGURED AS EVAPORATOR

PLAN VIEW

PLAN VIEW

MULTI-PHASE HEAT DISSIPATING DEVICE FOR AN ELECTRONIC DEVICE

CROSS-REFERENCE/CLAIM OF PRIORITY TO RELATED APPLICATIONS

The present application claims priority to U.S. Provisional Application No. 62/321,090 titled "TWO PHASE HEAT DISSIPATING DEVICE FOR AN ELECTRONIC DEVICE", filed Apr. 11, 2016. The present application is a continuation-in-part application of U.S. patent application Ser. No. 15/230,114 titled "MULTI-PHASE HEAT DISSIPATING DEVICE FOR AN ELECTRONIC DEVICE" filed Aug. 5, 2016. The present application claims priority to U.S. patent application Ser. No. 15/230,114, which claims priority to U.S. Provisional Application No. 62/321,090. The present application claims priority to U.S. Provisional Application No. 62/433,135 titled "MULTI-PHASE HEAT DISSIPATING DEVICE FOR AN ELECTRONIC DEVICE", filed Dec. 12, 2016. All of the above mentioned applications are hereby expressly incorporated by reference.

BACKGROUND

Field

Various features relate a heat dissipating device, and more specifically to a multi-phase heat dissipating device for an electronic device.

Background

Electronic devices include internal components that generate heat. Some of these internal components include a central processing unit (CPU), a graphics processing unit (GPU) and/or memory. Some of these internal components can generate a lot of heat. Specifically, a high performance CPU and/or GPU of an electronic device can generate a lot of heat, especially when performing data intensive operations (e.g., games, processing video).

To counter or dissipate the heat generated by the CPU and/or GPU, an electronic device may include a heat dissipating device, such as a heat spreader. FIGS. 1-3 illustrate an example of a mobile device that includes a heat spreader for dissipating heat generated by a chip. As shown in FIGS. 1 and 2, the mobile device 100 includes a display 102, a back side surface 200, a die 202, and a heat spreader 204. The die 202 and the heat spreader 204, which are both shown with dotted lines, are located inside the mobile device 100. The die 202 is coupled to a first surface of the heat spreader 204. A second surface of the heat spreader 204 is coupled to a first surface (e.g., inner surface) of the back side surface 200.

FIG. 3 illustrates a profile view of the mobile device 100 that includes the heat spreader 204. As shown in FIG. 3, the mobile device 100 includes the display 102, the back side surface 200, a front side surface 300, a bottom side surface 302, and a top side surface 304. FIG. 3 also illustrates a printed circuit board (PCB) 306, the die 202 and the heat spreader 204 inside the mobile device 100.

As further shown in FIG. 3, a first side of the die 202 is coupled to a first surface of the PCB 306. A second side of the die 202 is coupled to a first surface of the heat spreader 204. A second surface of the heat spreader 204 is coupled to a first surface (e.g., inner surface) of the back side surface 200. In this configuration, almost all of the heat that is generated by the die 202 is dissipated through the heat spreader 204 and the back side surface 200 of the mobile device. However, the heat spreader 204 has limitations, including its limited heat dissipating capabilities. For example, the heat spreader 204 implemented in a mobile device, may be limited to dissipate away about 3 Watts of heat.

Therefore, there is a need for an improved method and design for efficiently dissipating heat from an electronic device (e.g., mobile device), while at the same time keeping the temperature of the outer surface of the electronic device within a threshold that is acceptable to a user of the electronic device. In addition, there is a need for reducing the junction temperature of a heat generating region.

SUMMARY

Various features relate a heat dissipating device, and more specifically to a multi-phase heat dissipating device for an electronic device.

An example provides a device that includes a region comprising an integrated device and a heat dissipating device coupled to the region comprising the integrated device. The heat dissipating device is configured to dissipate heat away from the region. The heat dissipating device includes a fluid, an evaporator configured to evaporate the fluid, a condenser configured to condense the fluid, an inner wall coupled to the evaporator and the condenser, an outer shell encapsulating the fluid, the evaporator, the condenser and the inner wall, an evaporation portion configured to channel an evaporated fluid from the evaporator to the condenser, wherein the evaporation portion is at least partially defined by the inner wall, a plurality of evaporation portion walls in the evaporation portion, at least one evaporation portion wall comprising a non-orthogonal portion, and a collection portion configured to channel a condensed fluid from the condenser to the evaporator, wherein the collection portion is at least partially defined by the inner wall. The inner wall is a separation wall that prevents fluid leaving from the evaporator from mixing with fluid leaving from the condenser.

Another example provides a device that includes a region comprising an integrated device and a heat dissipating means coupled to the region comprising the integrated device. The heat dissipating means is configured to dissipate heat away from the region. The heat dissipating means includes a fluid, a means for evaporating configured to evaporate the fluid, a means for condensing configured to condense the fluid, an inner wall coupled to the means for evaporating and the means for condensing, an outer shell encapsulating the fluid, the means for evaporating, the means for condensing and the inner wall, an evaporation portion configured to channel an evaporated fluid from the means for evaporating to the means for condensing, where the evaporation portion is at least partially defined by the inner wall, a plurality of evaporation portion walls in the evaporation portion, at least one evaporation portion wall comprising a non-orthogonal portion, and a collection portion configured to channel a condensed fluid from the means for condensing to the means for evaporating, where the collection portion is at least partially defined by the inner wall. The inner wall is a separation wall that prevents fluid leaving from the means for evaporating from mixing with fluid leaving from the means for condensing.

Another example provides a method for fabricating a device. The method assembles a device that includes a region. The method provides an integrated device in the region of the device. The method forms a heat dissipating device. Forming the heat dissipating device includes forming an evaporator configured to evaporate a fluid; forming a condenser configured to condense the fluid; forming an inner wall and coupling the inner wall to the evaporator and the condenser, where the inner wall is a separation wall that prevents fluid leaving from the evaporator from mixing with fluid leaving from the condenser; forming an outer shell that encapsulates, the evaporator, the condenser and the inner wall; forming an evaporation portion configured to channel an evaporated fluid from the evaporator to the condenser, wherein the evaporation portion is at least partially defined by the inner wall; forming a plurality of evaporation portion walls in the evaporation portion, at least one evaporation portion wall comprising a non-orthogonal portion; forming a collection portion configured to channel a condensed fluid from the condenser to the evaporator, wherein the collection portion is at least partially defined by the inner wall; and providing the fluid inside the heat dissipating device. The method couples the heat dissipating device to the region comprising the integrated device, the heat dissipating device configured to dissipate heat away from the region.

Another example provides a method for operating a heat dissipating device. The method receives heat from an integrated device, at an evaporator. The method evaporates a fluid at the evaporator based on the received heat. The method channels the evaporated fluid through an evaporation portion to a condenser, where the evaporation portion is at least partially defined by an inner wall. The method condenses the evaporated fluid at the condenser. The method transfers heat away from the fluid through the condenser. The method channels the condensed fluid through a collection portion to the evaporator, where the collection portion is at least partially defined by the inner wall. The inner wall is coupled to the evaporator and the condenser. The inner wall is a separation wall that prevents fluid leaving from the evaporator from mixing with fluid leaving from the condenser.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may or may not be shown in block diagrams in order to avoid obscuring the aspects in unnecessary detail. In other instances, well-known circuits, structures and techniques may not be shown in detail in order not to obscure the aspects of the disclosure.

Overview

Some implementations provide a device (e.g., mobile device) that includes a region comprising an integrated device (e.g., chip, die), and a heat dissipating device coupled to the region comprising the integrated device. The heat dissipating device may be a multi-phase heat dissipating device. The heat dissipating device is configured to dissipate heat away from the region. The heat dissipating device includes a fluid, an evaporator configured to evaporate the fluid, a condenser configured to condense the fluid, an inner wall coupled to the evaporator and the condenser, an outer shell encapsulating the fluid, the evaporator, the condenser and the inner wall, an evaporation portion configured to channel an evaporated fluid from the evaporator to the condenser, where the evaporation portion is at least partially defined by the inner wall, and a collection portion configured to channel a condensed fluid from the condenser to the evaporator, where the collection portion is at least partially defined by the inner wall. In some implementations, the region may include a thermal interface material (TIM) coupled to the integrated device and the heat dissipating device.

Exemplary Multi-Phase Heat Dissipating Device

Figure 2:
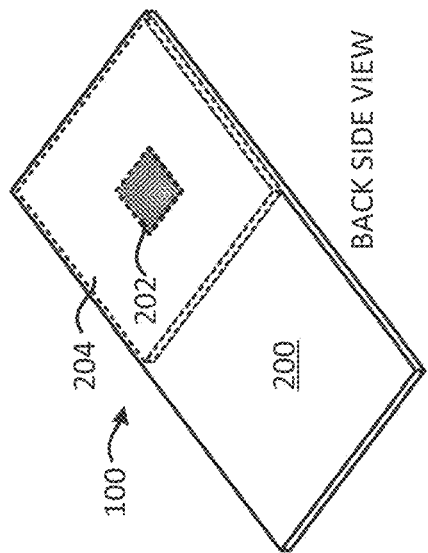
FIG. 2 illustrates a back view of a mobile device that includes a heat spreader.
Figure 1:
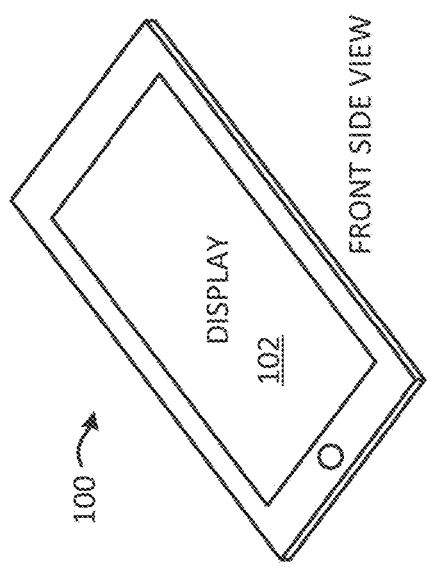
FIG. 1 illustrates a front view of a mobile device.
Figure 3:
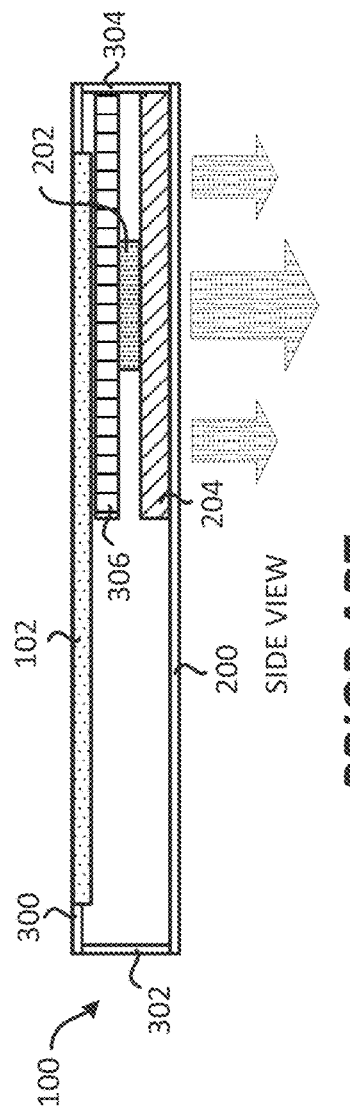
FIG. 3 illustrates a profile view of a mobile device that includes a heat spreader.
Figure 4:
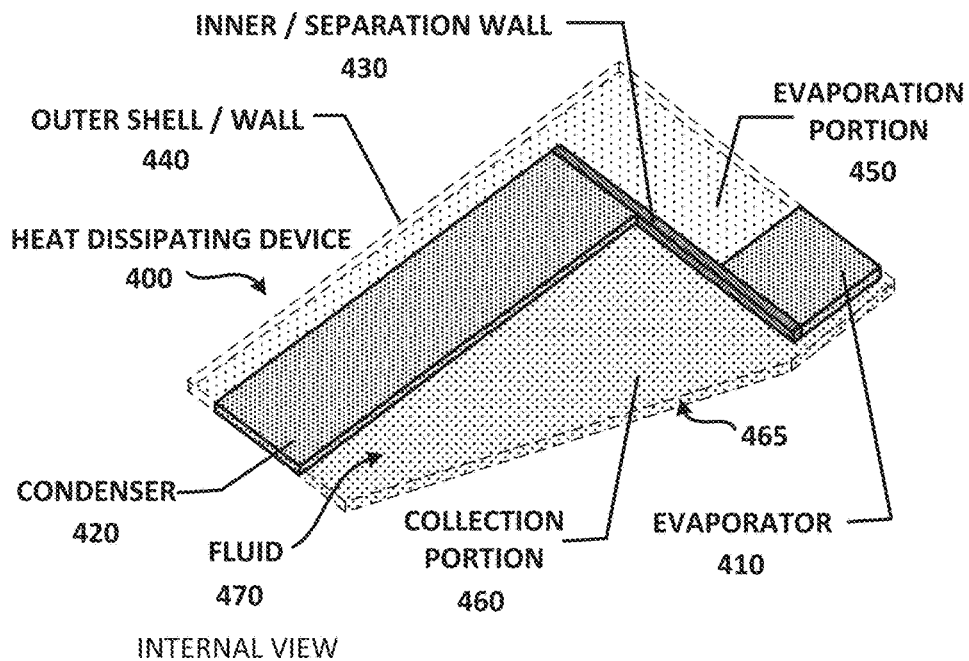
FIG. 4 illustrates an internal view of a heat dissipating device.

FIG. 4 illustrates a heat dissipating device 400 that includes an evaporator 410, a condenser 420, an inner wall 430, an outer shell 440, an evaporation portion 450, a collection portion 460, and a fluid 470. The evaporator 410 may be a means for evaporating. The condenser 420 may be a means for condensing. The collection portion 460 includes at least one angled portion 465 (e.g., non-orthogonal angled portion). As will be further described below, the at least one angled portion 465 is configured to help direct fluid towards the evaporator 410 (e.g., through gravity).

In some implementations, the heat dissipating device 400 (e.g., heat dissipating means) is a multi-phase heat dissipating device. As will be further described below, the heat dissipating device 400 may be a cooling device that provides heat dissipation through recirculation of a fluid in the outer shell 440 without the need of a pump or compressor.

The outer shell 440 is configured to encapsulate the evaporator 410, the condenser 420, the inner wall 430, the evaporation portion 450, the collection portion 460, and the fluid 470. The evaporator 410 is coupled to the inner wall 430. The inner wall 430 is coupled to the condenser 420. The evaporation portion 450 of the heat dissipating device 400 is defined by a first surface of the evaporator 410, a first surface of the inner wall 430, a first surface of the condenser 420, and/or a first portion of the outer shell 440. The collection portion 460 of the heat dissipating device 400 is defined by a second surface of the evaporator 410, a second surface of the inner wall 430, and a second surface of the condenser 420 and/or a second portion of the outer shell 440. The inner wall 430 may be a separation wall that prevents fluid leaving the evaporator 410 from mixing with fluid leaving from the condenser 420.

FIG. 4 illustrates the fluid 470 is located inside the heat dissipating device 400. For example, the fluid 470 is located inside the outer shell 440 of the heat dissipating device 400. The fluid 470 is configured to flow inside the heat dissipating device 400. In some implementations, the flow of the fluid 470 inside the heat dissipating device 400 allows for the efficient heat transfer from one portion of the heat dissipating device 400 to another portion of the heat dissipating device 400. For example, the fluid 470 may be configured to allow heat to transfer or flow from the evaporator 410 to the condenser 420. Thus, heat (e.g., from heat generating region, integrated device) coming in through the evaporator 410 may be released through the condenser 420 in some implementations.

FIG. 4 illustrates that the fluid 470 is located in the collection portion 460 of the heat dissipating device 400. However, in some implementations, the fluid 470 may be located in other portions (e.g., the evaporator 410, the condenser 420, the evaporation portion 450) of the heat dissipating device 400. The fluid 470 may have different phases, including a liquid phase and a gas phase. In some implementations, the fluid 470 may be a combination of a liquid phase and a gas phase. In some implementations, a vapor phase of the fluid 470 may be a combination of a liquid phase and a gas phase. In some implementations, the temperature at which the fluid changes from a liquid phase to a gas phase is referred to as the boiling temperature of the fluid. In some implementations, the fluid 470 has a boiling temperature of about 40 Celsius or less. In some implementations, the fluid 470 may be in different phases in different portions of the heat dissipating device 400.

A more detailed example of how the fluid 470 may flow in the heat dissipating device 400, how heat may be dissipated and/or transferred, and the different phases of the fluid 470 are further described and illustrated below in FIG. 10.

Figure 5:
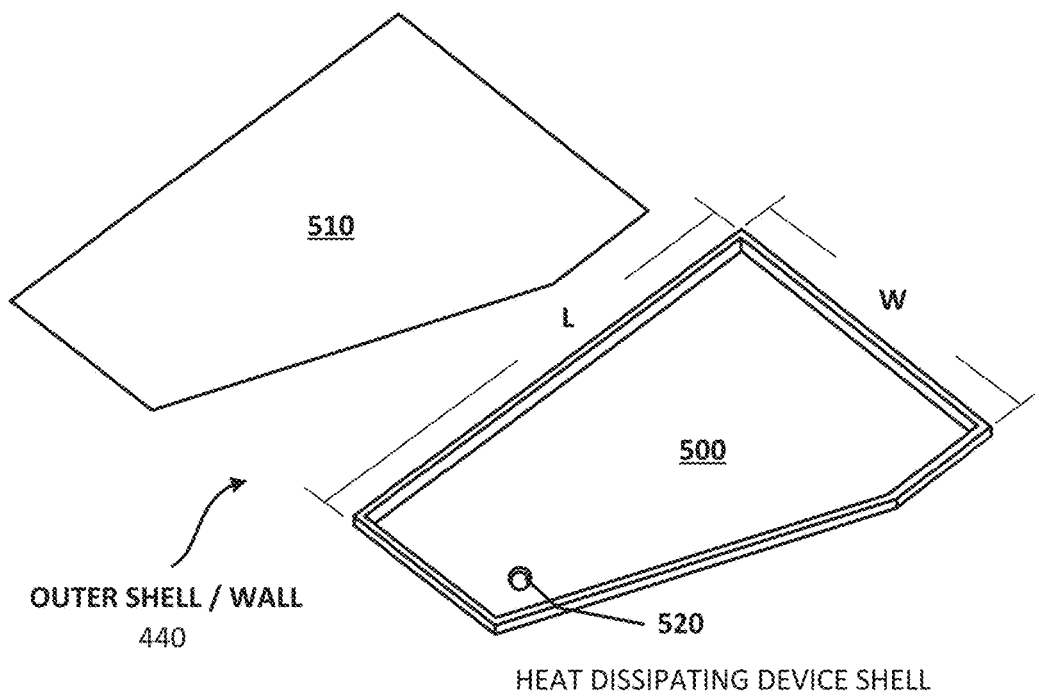
FIG. 5 illustrates an assembly view of an outer shell of the heat dissipating device.

FIG. 5 illustrates an example of an assembly view of the outer shell 440 of the heat dissipating device 400. As shown in FIG. 5, in some implementations, the outer shell 440 may include a first shell 500 and a second shell 510. The first shell 500 may include a base portion and several side walls. The first shell 500 may be a unibody shell or several walls and/or surfaces. The second shell 510 may be a cover configured to couple to the first shell 500 so as to form an enclosure. A coupling process (e.g., welding process, an adhesive process) may be used to couple the second shell 510 to the first shell 500 to form the outer shell 440. As will be further described and illustrated below in FIG. 6, the evaporator 410, the condenser 420, and the inner wall 430 may be formed inside the first shell 500 and the second shell 510. The first shell 500 includes a cavity 520. In some implementations, the cavity 520 is formed so that a fluid (e.g., fluid 470) may be provided in the heat dissipating device 400. After the fluid is provided through the cavity 520, the cavity 520 is sealed to create a sealed (e.g., hermetically sealed) heat dissipating device. It is noted that the cavity may have different shapes and sizes. Moreover, the cavity 520 may be formed in different portions of the first shell 500. In some implementations, the cavity 520 may be formed in the second shell 510. As shown in FIG. 5, the cavity 520 is formed near or around the collection portion 460 of the heat dissipating device. However, in some implementations, the cavity 520 may be formed in other portions (e.g., evaporation portion 450). Although FIG. 5 illustrates a cavity 520, the cavity 520 may be sealed or plugged to prevent fluid from escaping or entering the heat dissipating device. For purpose of clarity, the cavity 520 (or sealed cavity or plug) is not shown in other figures of the present disclosure. However, the cavity 520 (or sealed cavity or plug) may be implemented in any of the heat dissipating devices shown and described in the present disclosure.

In some implementations, the heat dissipating device 400 is a heat dissipating means configured to be coupled to a region (e.g., heat generating region) of a device (e.g., mobile device) that generates heat. The heat generating region may include an integrated device (e.g., die, chip, package, central processing unit (CPU), graphical processing unit (GPU)). The heat generating region may also include a thermal interface material (TIM) that is coupled to the integrated device. Examples of the heat dissipating device 400 coupled to an integrated device and/or a TIM are further described and illustrated below in at least FIGS. 9, 11 and 12.

Different implementations may use different materials for the heat dissipating device 400, the evaporator 410, the condenser 420, the inner wall 430, the outer shell 440, the evaporation portion 450, the collection portion 460, and the fluid 470. Examples of the different materials that can be used are further described below.

Exemplary Materials and Fluids

The heat dissipating device 400 and its components may include different materials. In some implementations, the evaporator 410, the condenser 420, the inner wall 430, the outer shell 440 may include a thermally conductive material, such as metal, copper, Aluminum, Aluminum-Nitride (Ceramic), and/or combination thereof.

Table 1 below illustrates exemplary materials and their corresponding properties for materials that may be used in the heat dissipating device 400, or any heat dissipating device described in the present disclosure.

TABLE 1

Exemplary Materials and Properties for components of heat dissipating device

| Material | Density (kg/m$^3$) | Thermal Conductivity Value (Watts/m-C) | Specific Heat (Joules/kg-C) |
|---|---|---|---|
| Copper | 8933 | 388 | 385 |
| Aluminum | 2707 | 220 | 896 |
| Aluminum-Nitride (Ceramic) | 3320 | 177 | 780 |

A particular thermal conductivity value of a particular material quantifies how well or how poorly a particular material conducts heat. Different implementations may also use different fluids in the heat dissipating device 400. Table 2 below illustrates exemplary fluids and their corresponding properties.

TABLE 2

Exemplary Fluids and Properties

| Fluid | Liquid Density (kg/m$^3$) | Liquid Viscosity (mPa-s) | Latent Heat (Joules/kg-K) | Specific Heat (Joules/kg-K) |
|---|---|---|---|---|
| Refrigerant R134a | 1218 | 202.3 | 177.8 | 1424.6 |
| Refrigerant R236fa | 1369.8 | 296.5 | 145.9 | 1264.4 |
| Refrigerant R245fa | 1346.6 | 423.3 | 190.3 | 1264.4 |
| Refrigerant R1234ze | 1165.5 | 209.6 | 167.1 | 1388.7 |

In some implementations, the heat dissipating device 400 may use different combinations of the materials and/or fluids listed above. However, it is noted that other implementations may use different materials and fluids, or combinations thereof than the ones listed above.

The use of the materials and the design of the heat dissipating device in the present disclosure allows for effective and efficient heat transfer or heat removal from a heat generating region of a device. In some implementations, the evaporator 410 may be configured to have a maximum heat transfer coefficient of about 32.8 kW/m$^2$k. In some implementations, the condenser 420 is configured to have a maximum heat transfer coefficient of about 9.27 kW/m$^2$k. However, different implementations may have different maximum heat transfer coefficients.

In some implementations, the evaporator 410 may comprise a critical heat flux at exit of about 26.9 W/cm$^2$. In some implementations, the heat dissipating device 400 may be configured to dissipate up to about 18 Watts of heat, which is substantially more than the heat spreader 204 (which is rated at about 3 Watts for mobile devices). In some implementations, the heat dissipating device 400 may be able to dissipate the above mentioned heat while having dimensions that measure about 135 mm (L)×65 mm (W)×0.6 mm (H) or less. Thus, given its dimensions, the heat dissipating device 400 may be implemented in a mobile device to dissipate much more heat than the heat spreader 204. It is noted that other heat dissipating devices in the disclosure may have dimensions that are the same, similar or different than the dimensions mentioned above.

Having described the structure and components of the heat dissipating device 400, a high level exemplary method for fabricating the heat dissipating device 400 will now be described below.

Exemplary Sequence for Fabricating a Heat Dissipating Device

Figure 6:
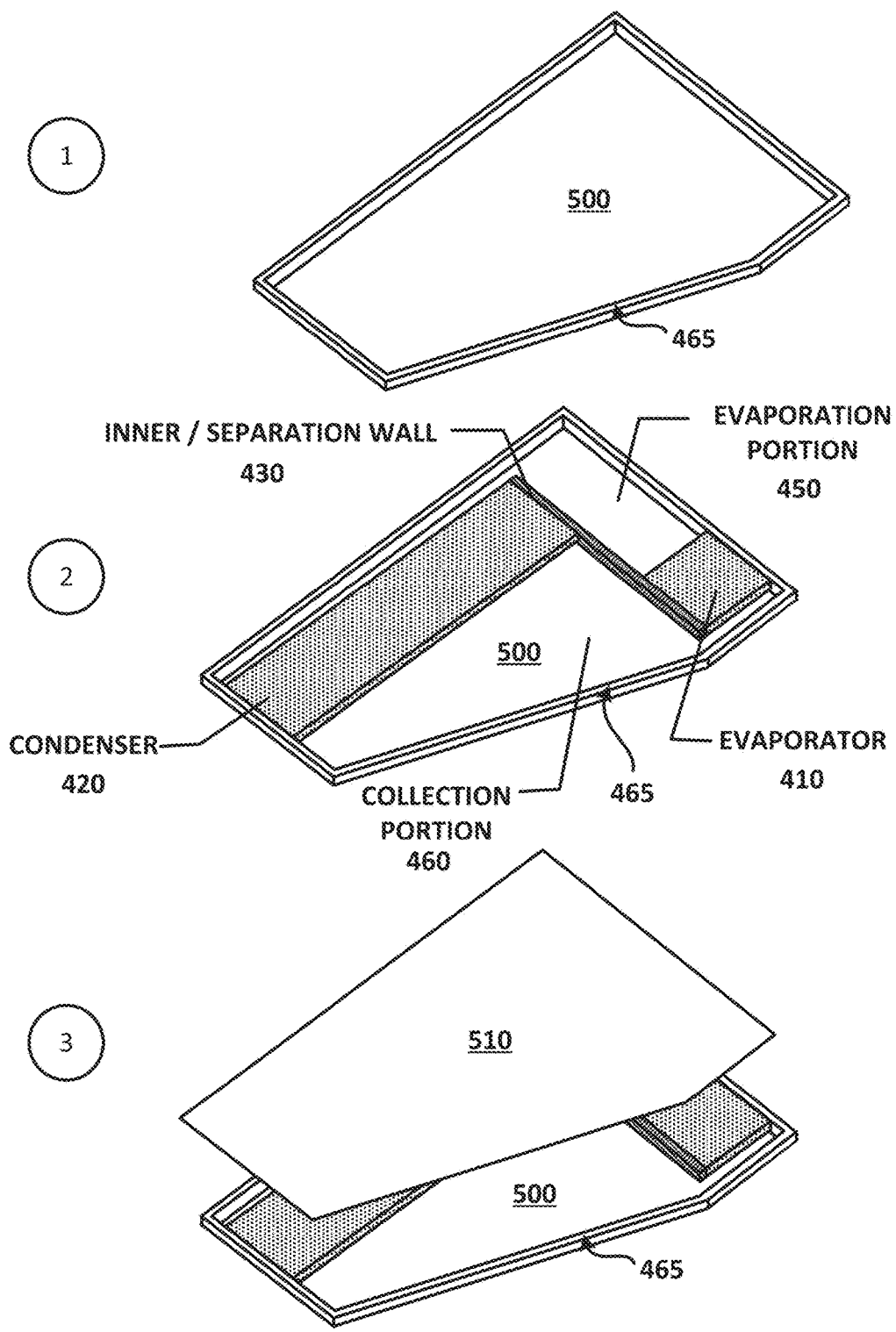
FIG. 6 illustrates a sequence for fabricating a heat dissipating device.

FIG. 6 illustrates a high level exemplary sequence for fabricating a heat dissipating device. In some implementations, the sequence may be used to fabricate the heat dissipating device 400 (e.g., heat dissipating means) or any other heat dissipating device described in the present disclose. In some implementations, the order of the sequence may be changed or modified. In some implementations, several processes may be combined as one.

Stage 1 of FIG. 6, illustrates a state after the first shell 500 is provided. In some implementations, providing the first shell 500 includes fabricating a shell that includes several surfaces and walls.

Stage 2 illustrates a state after the evaporator 410, the condenser 420, and the inner wall 430 are coupled to the first shell 500. In some implementations, the evaporator 410, the condenser 420 and/or the inner wall 430 are fabricated separately, assembled together and then coupled to the first shell 500. In some implementations, the evaporator 410, the condenser 420 and/or the inner wall 430 are fabricated concurrently with the first shell 500 (e.g., to form a unibody shell that includes the evaporator 410, the condenser 420 and/or the inner wall 430). In other words, the evaporator 410, the condenser 420 and/or the inner wall 430 may be built together as one piece. An adhesive may be used to couple the evaporator 410, the condenser 420 and/or the inner wall 430 to each other, and/or to the first shell 500. In some implementations, a welding process and/or a mechanical process may be used to couple the evaporator 410, the condenser 420 and/or the inner wall 430 to each other and/or the first shell 500.

As further shown in stage 2, coupling the evaporator 410, the condenser 420 and/or the inner wall 430 to the first shell 500 forms the evaporation portion 450 and the collection portion 460 of a heat dissipating device.

In some implementations, a fluid (e.g., fluid 470) may be provided in at least the collection portion 460. The fluid may flow into different portions of the heat dissipating device (e.g., the evaporator 410, the condenser 420, the evaporation portion 450). The fluid may fill part or all of the heat dissipating device. In some implementations, the fluid may be provided during a different stage of the fabrication process. As described below, the fluid 470 may be provided after the heat dissipating device 400 is fabricated and the fluid 470 is provided through a small cavity (e.g., cavity 520), which is subsequently sealed.

Stage 3 illustrates a state as the second shell 510 is coupled to the first shell 500 to form the outer shell 440 of the heat dissipating device 400. The second shell 510 may be coupled to the first shell 500 through an adhesive, a welding process and/or a mechanical coupling process. The combination of the first shell 500 and the second shell 510 encapsulates the evaporator 410, the condenser 420, the inner wall 430 and/or the fluid 470. In some implementations, the combination of the first shell 500, the second shell 510, the evaporator 410, the condenser 420 and/or the inner wall 430 defines the boundaries of the evaporation portion 450 and the collection portion 460, as well as the heat dissipating device 400.

In some implementations, as mentioned above, some or all of the fluid (e.g., fluid 470) may be provided after the second shell 510 is coupled to the first shell 500. In such instances, a small cavity (e.g., hole) may be formed in the first shell 500 or the second shell 510, so that the fluid may be provided in the heat dissipating device. An example of the cavity is cavity 520 described in FIG. 5. After the fluid is provided through the small cavity (not shown), the small cavity is sealed to create a sealed (e.g., hermetically sealed) heat dissipating device.

Exemplary Multi-Phase Heat Dissipating Devices

The heat dissipating device 400 may have different configurations. In some implementations, portions of the heat dissipating device 400 may be exposed (e.g., not covered by the outer shell 440), or may be integrated as part of the outer shell 440. In some implementations, the heat dissipating device 400 may be completely positioned outside of the outer shell 440.

Figure 7:
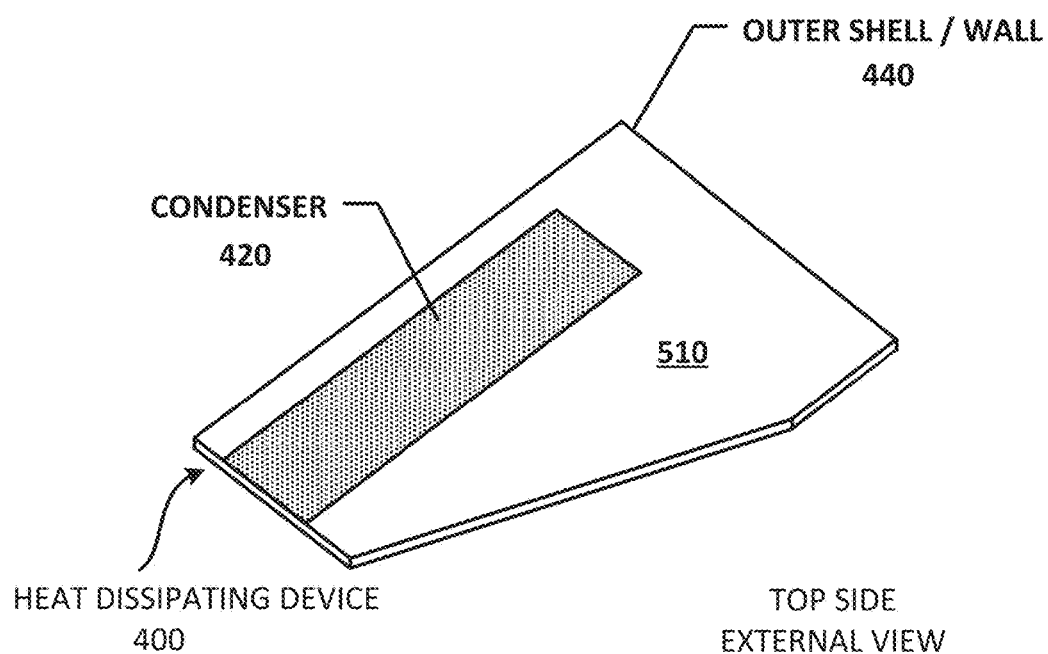
FIG. 7 illustrates an external view of a heat dissipating device.

FIG. 7 illustrates the heat dissipating device 400 where a portion (e.g., surface) of the condenser 420 is not covered by the outer shell 440 (e.g., not covered by the second shell 510). In particular, a condenser region (as illustrated by the shaded region) of the condenser 420 is not covered by the outer shell 440. In some implementations, this configuration may provide better heat transfer for the condenser 420. Alternatively, a portion of the condenser 420 may be integrated with the outer shell 440 (e.g., integrated with the second shell 510) such that a surface of the condenser 420 is exposed to an external environment.

Figure 8:
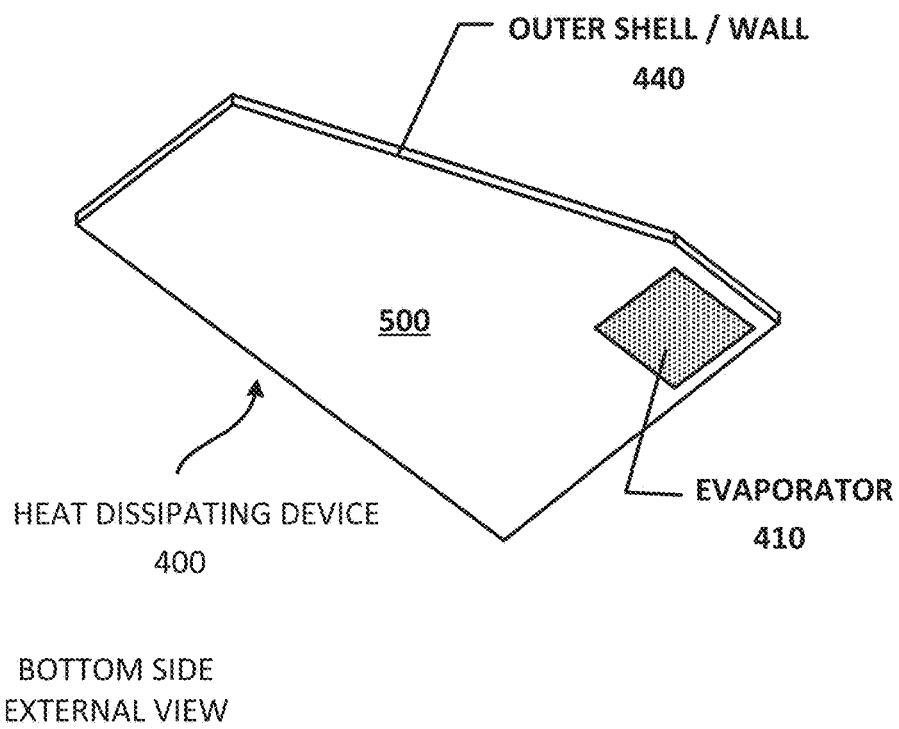
FIG. 8 illustrates another external view of a heat dissipating device.

FIG. 8 illustrates the heat dissipating device 400 where a portion (e.g., surface) of the evaporator 410 is not covered by the outer shell 440 (e.g., not covered by the first shell 500). In particular, an evaporator region (as illustrated by the shaded region) of the evaporator 410 is not covered by the outer shell 440. In some implementations, this configuration may provide better heat transfer for the evaporator 410. Alternatively, a portion of the evaporator 410 may be integrated with the outer shell 440 (e.g., integrated with the first shell 500) such that a surface of the evaporator 410 is exposed to an external environment.

In some implementations, other portions of the evaporator 410 and/or the condenser 420 may be exposed, not covered by the outer shell 440 and/or integrated with the outer shell 440. The evaporator 410, the condenser 420, and/or the outer shell may be fabricated together or separately.

Exemplary Heat Flow of Heat Dissipating Device

Figure 9:
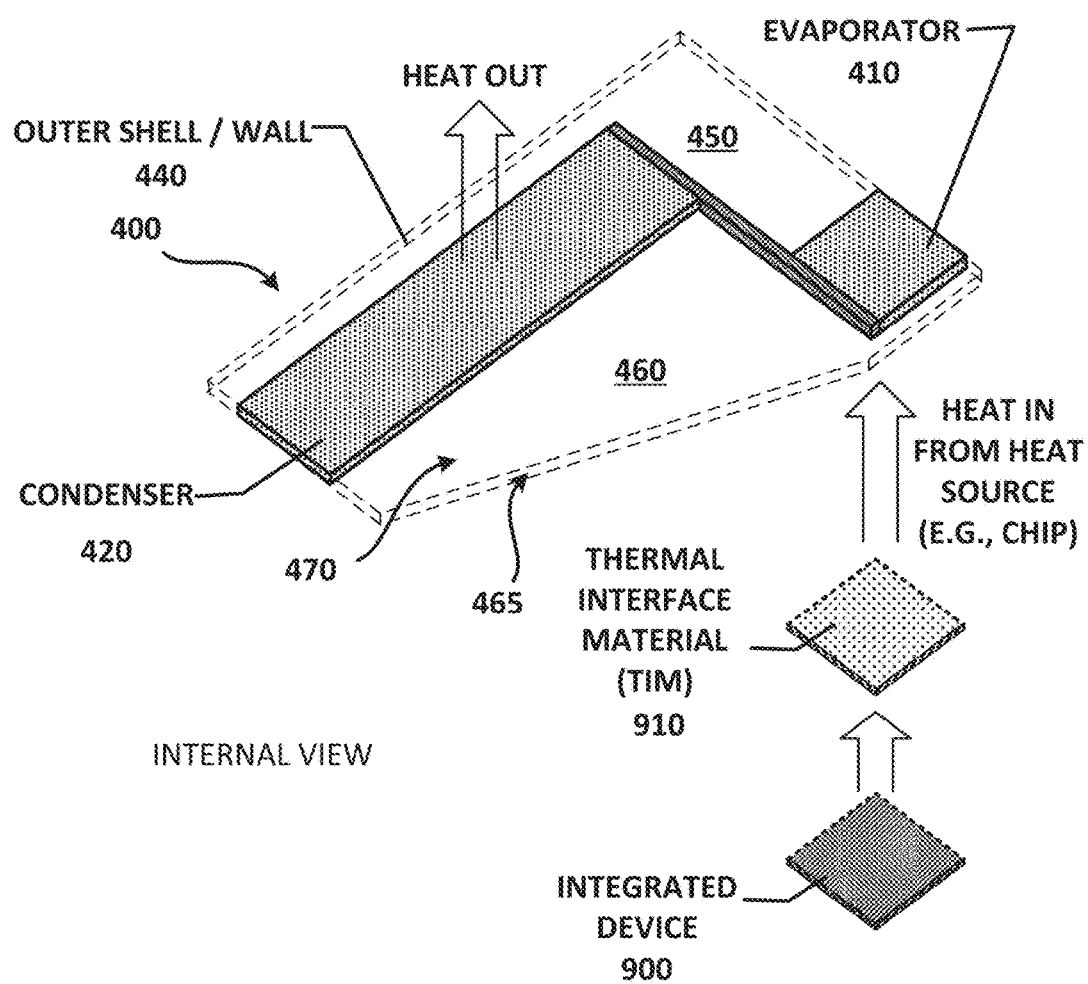
FIG. 9 illustrates a view of how a heat dissipating device coupled to a chip may dissipate heat away from the chip.

FIG. 9 illustrates how the heat dissipating device 400 may be utilized to dissipate heat away from a heat generating region of a device (e.g., mobile device). As shown in FIG. 9, the heat dissipating device 400 may be coupled to an integrated device 900 (e.g., die, chip, package, central processing unit (CPU), graphical processing unit (GPU)) through a thermal interface material (TIM) 910. The thermal interface material (TIM) 910 may be an adhesive that couples the heat dissipating device 400 to the integrated device 900. The thermal interface material (TIM) 910 may include appropriate thermal conductivity properties so that heat generated from the integrated device 900 may thermally transfer to the heat dissipating device 400.

The heat dissipating device 400 is placed over the integrated device 900 and the thermal interface material (TIM) 910 such that the evaporator 410 is over the integrated device 900 and the thermal interface material (TIM) 910.

As shown in FIG. 9, heat from the integrated device 900 thermally conducts through the thermal interface material (TIM) 910 and to the evaporator 410. The evaporator 410 is thus heated, which in turns heats the fluid 470 (which is in liquid phase) from the collection portion 460. The fluid 470 that is heated from the evaporator 410 turns into a gas phase or a vapor phase, and then travels from the evaporator 410 through the evaporation portion 450 and to the condenser 420. The inner wall 430 prevents the fluid exiting the evaporator 410 from mixing with fluids exiting the condenser 420.

When the fluid 470 (which is in a gas phase or vapor phase) reaches the condenser 420, heat is transferred away from the fluid 470 through the condenser 420, and escapes out of the heat dissipating device 400. Once the fluid 470 passes through the condenser 420, it returns to liquid phase (e.g., or at least partially liquid phase) into the collection portion 460.

The heat dissipating device 400 may have different configurations. In some implementations, portions of the heat dissipating device 400 may be exposed (e.g., not covered by the outer shell 440), or may be integrated as part of the outer shell 440.

As shown in FIG. 9 and the present disclosure, the condenser 420 has a bigger size than the evaporator 410. In some implementations, this is done to spread out the heat over a bigger area to prevent the device from reaching a critical temperature. In addition, the condenser 420 may have a bigger size than the evaporator 410 to help fully condense the vapors coming from the evaporator 410. For example, the size of the condenser 420 may be selected so that the heat dissipating device 400 dissipates as much heat as possible while still keeping a surface temperature of the device to be less than an acceptable for a user of the device (e.g., mobile device). Thus, by making the condenser 420 larger (e.g., larger surface area) than the evaporator 410, it ensures that the condenser 420 can effectively dissipate the heat through the evaporator while keeping the surface temperature of the device below a threshold temperature and help fully condense the vapors. In addition, by making the condenser 420 larger than the evaporator 410, it helps prevent dry out in the heat dissipating device 400. Dry out occurs when the condenser 420 is not capable of dissipating heat fast enough, thus is not able to fully convert the vapors into condensate liquid (e.g., leaving no liquid fluid or very little of it). When dry out occurs, the fluid inside the heat dissipating device does not flow well, resulting in very little recirculation of the fluid in the heat dissipating device 400.

Figure 10:
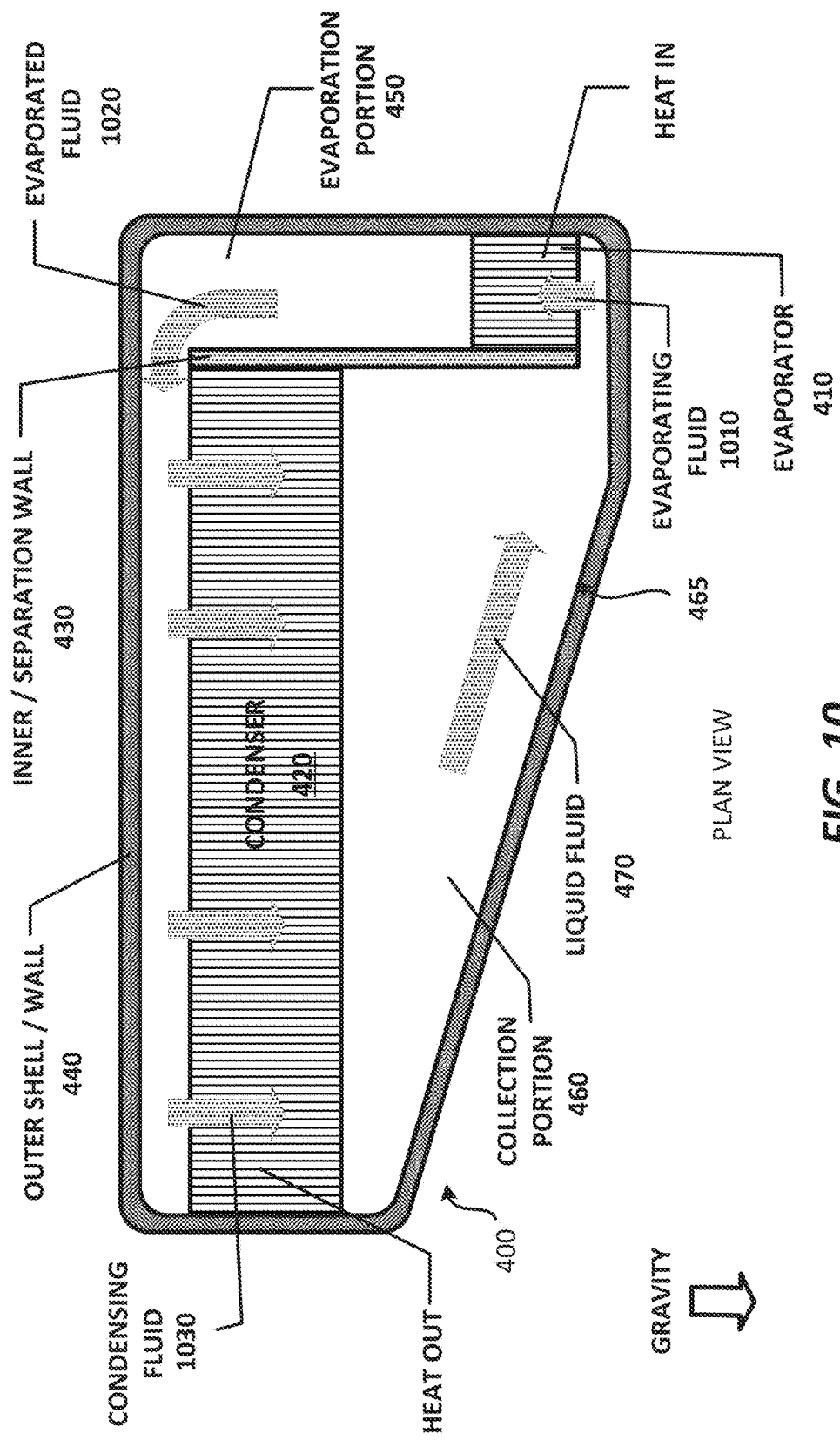
FIG. 10 illustrates a view of fluid flow in a heat dissipating device.

FIG. 10 illustrates a fluid flow of the fluid in the heat dissipating device. More, specifically, FIG. 10 illustrates how the fluid flow inside the heat dissipating device 400 provides efficient heat dissipation of an integrated device. The heat dissipating device 400 provides a cooling device that is capable of recirculating the fluid without the need of a pump or compressor. In some implementations, the recirculation of the fluid inside the heat dissipating device 400 is aided by gravity. Gravity helps improve the heat dissipating capabilities of the heat dissipating device 400 and allows the heat dissipating device 400 to work properly. The heat dissipating device 400 may be designed in such a way as to perform better in certain orientations (e.g., horizontal orientation of the device, vertical orientation of the device). In some implementations, the optimal orientation of the heat dissipating device 400 is one where the evaporator 410 is positioned lower than the condenser 420 and gravity helps fluid flow from the condenser 420, through the collection portion 460 and towards the evaporator 410.

As mentioned above, the collection portion 460 includes at least one angled portion 465. The at least one angled portion 465 may include a non-orthogonal angled portion. The non-orthogonal angled portion is configured, with the help of gravity, to direct the condensed fluid towards the evaporator 410 (e.g., means for evaporating). In some implementations, the collection portion 460 may include one or more non-orthogonal angled portions. A non-orthogonal portion may include different angles. A non-orthogonal portion is a portion (e.g., wall) that includes a non-right angled portion (e.g., wall) relative to an edge of the heat dissipating device 400.

FIG. 10 illustrates the fluid 470 in the collection portion 460 of the heat dissipating device 400. The collection portion 460 has at least one angled portion so that the fluid 470 (which is in liquid form) flows down (e.g., due to gravity) towards the evaporator 410. The evaporator 410 is being heated by a heat generating region (e.g., TIM, integrated device). The collection portion 460 channels the fluid 470 to the evaporator 410. In some implementations, the at least one angled portion helps channels and direct the fluid 470 towards the evaporator 410.

As the fluid 470 enters the evaporator 410 and travels through the evaporator 410, the fluid 470 becomes an evaporating fluid 1010 due to the heat from heat source (e.g., integrated device) that is passed through the evaporator 410 (e.g., heat is transferred from the heat source to the fluid through the evaporator 410). The evaporator 410 is configured so that the pressure drop between the fluid entering the evaporator 410 and the fluid exiting the evaporator 410 is about 0.0049 bar or less. In some implementations, the pressure drop across the evaporator 410 needs to be below 0.0049 bar so that the fluid is not blocked from passing through the evaporator 410, which would block the recirculation of the fluid in the heat dissipating device 400. The above values are merely exemplary. Different designs may have different values.

Once the evaporating fluid 1010 exits the evaporator 410, the evaporating fluid 1010 becomes an evaporated fluid 1020 (e.g., vapor fluid) that travels through the evaporation portion 450 towards the condenser 420. The evaporation portion 450 helps channel the evaporated fluid 1020 towards the condenser 420. The evaporated fluid 1020 may include fluid in a gas phase and some fluid in liquid phase. FIG. 10 illustrates that the inner wall 430 is a separation wall that prevents the evaporated fluid 1020 in the evaporation portion 450 from mixing with the fluid 470 in the collection portion 460.

As the evaporated fluid 1020 enters the condenser 420 (e.g., means for condensing) and travels through the condenser 420, the evaporated fluid 1020 becomes a condensing fluid 1030. This process takes heat away from the evaporated fluid 1020 and through the condenser 420. The heat from the condenser 420 then escapes out of the heat dissipating device 400 (e.g., heat is transferred away from the fluid through the condenser 420 and escapes out of the heat dissipating device 400).

In some implementations, the condenser 420 is configured so that the pressure drop between the fluid entering the condenser 420 and the fluid exiting the condenser 420 is about 0.0002 bar or less. In some implementations, the pressure drop across the condenser 420 needs to be below 0.0002 bar so that the fluid is not blocked from passing through the condenser 420, which would block the recirculation of the fluid in the heat dissipating device 400.

Once the condensing fluid 1030 exits the condenser, the condensing fluid 1030 returns to the collection portion 460 as the fluid 470 (e.g., condensed fluid), in liquid phase, and the cycle repeats itself (e.g., there is recirculation of the fluid).

FIG. 10 illustrates how the heat dissipating device 400 uses recirculation of a fluid to achieve heat dissipation and cooling without the need of a pump or compressor to move the fluid. In some implementations, fluid recirculation in the heat dissipating device 400 is possible through the use of the various designs and/or components of the heat dissipating device 400.

For example, an angled portion (e.g., at least one angled portion 465) may help channel, direct and/or return the condensed liquid (e.g., via gravity) to the evaporator 410.

In another example, the inner wall 430 is a separation wall that prevents the fluid 470 from mixing with the evaporated fluid 1020 (e.g., vapor fluid) in the collection portion 460. It is important that the evaporated fluid 1020 and the fluid 470 are separated so that there is recirculation of the fluid in the heat dissipating device 400.

In another example, the evaporator 410 and the condenser 420 are designed in such a way as to minimize the pressure drop as the fluid travels across the evaporator 410 and the condenser 420. The minimizing of pressure drops can be achieved by selecting appropriate dimensions for the channels in which the fluid travels through. Examples of dimensions for the channels for the evaporator 410 and the condenser 420 are described below in at least FIGS. 17-18.

In another example, the dimensions of the evaporator 410 and the condenser 420 are selected so as to prevent dry out in the heat dissipating device 400. As mentioned above, dry out is when the condenser 420 is not dissipating heat fast enough in the heat dissipating device 400 (relative to how fast heat is coming in from the evaporator 410), causing the fluid in heat dissipating device 400 to turn into a gas phase (with little or no liquid phase). When dry out occurs, little recirculation occurs. Examples of dimensions for the evaporator 410 and the condenser 420 are described below in at least FIGS. 17-18.

In some implementations, the heat dissipating device 400 operates optimally when the heat dissipating device 400 is arranged such that the evaporator 410 is located in a lower position than the condenser 420, so as to take advantage of gravity pulling the fluid 470 towards the evaporator 410. In some implementations, fluid recirculation in the heat dissipating device when the temperature of the fluid is about 40 degree Celsius or higher (e.g., boiling temperature of the fluid). However, fluid recirculation may begin at different temperatures for different implementations, since various fluids boil at different temperatures.

Exemplary Device Comprising Heat Dissipating Device

Figure 11:
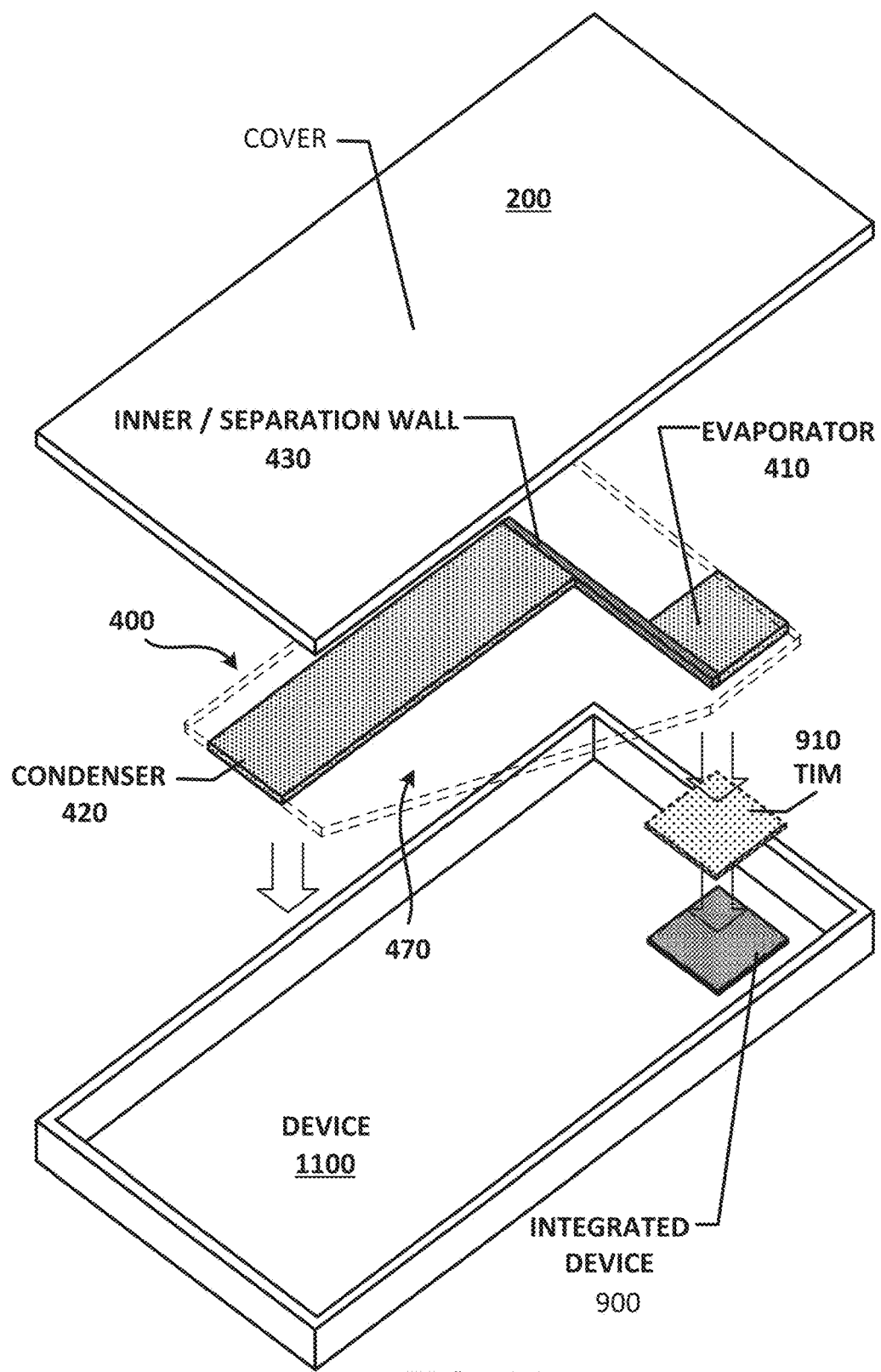
FIG. 11 illustrates an assembly view of a device that includes a heat dissipating device coupled to a chip inside the device.

FIG. 11 illustrates an assembly view of a device 1100 that includes the heat dissipating device 400, the integrated device 900 and the thermal interface material (TIM) 910. The device 1100 may be a mobile device (e.g., phone, tablet). As shown in FIG. 11, the heat dissipating device 400 includes the evaporator 410, the condenser 420, the inner wall 430, the outer shell 440, the evaporation portion 450, the collection portion 460, and the fluid 470.

As shown in FIG. 11, the integrated device 900 is coupled to the thermal interface material (TIM) 910, which is coupled to the heat dissipating device 400. In particular, the heat dissipating device 400 is coupled to a portion of the outer shell 440 that is nearest to the evaporator 410.

Figure 12:
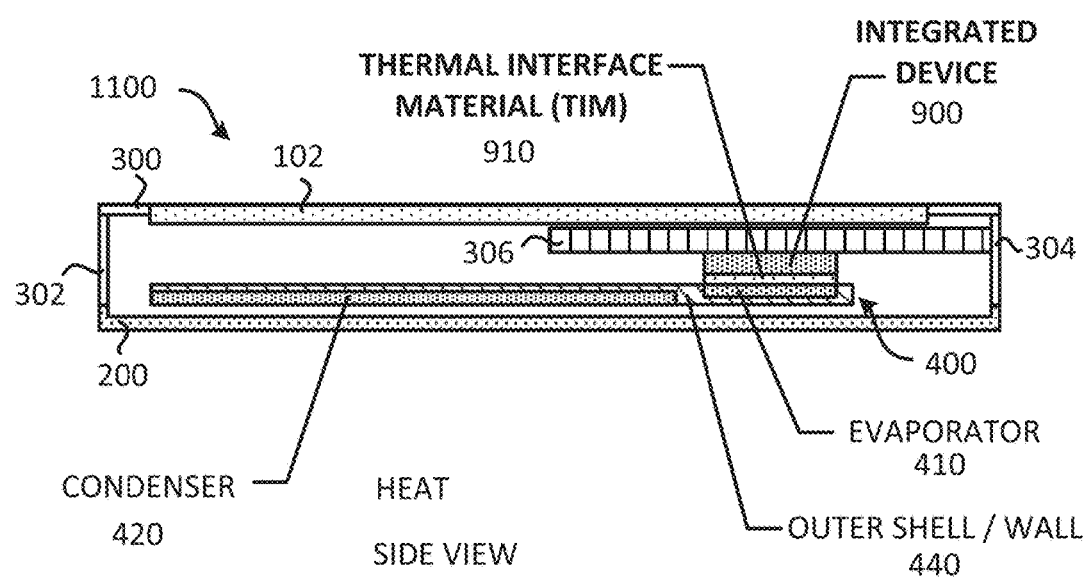
FIG. 12 illustrates a profile view of a device that includes a heat dissipating device coupled to a chip inside the device.

FIG. 12 illustrates a profile view of the device 1100. The device 1100 includes the display 102, the back side surface 200, the front side surface 300, the bottom side surface 302, and the top side surface 304. FIG. 11 also illustrates a printed circuit board (PCB) 306, the integrated device 900, the thermal interface material (TIM) 910, and the heat dissipating device 400 inside the device 1100. FIG. 12 illustrates that the heat dissipating device 400 is not touching the back side surface 200 of the device 1100. However, in some implementations, the heat dissipating device 400 may touch the back side surface 200. In some implementations, the heat dissipating device 400 may be coupled to a heat spreader.

Exemplary Heat Dissipating Devices

FIGS. 13-16 illustrate profile views of various heat dissipating devices with different configurations. The heat dissipating devices (e.g., 1300-1600) shown in FIGS. 13-16 may be more detailed examples of the heat dissipating device 400.

Figure 13:
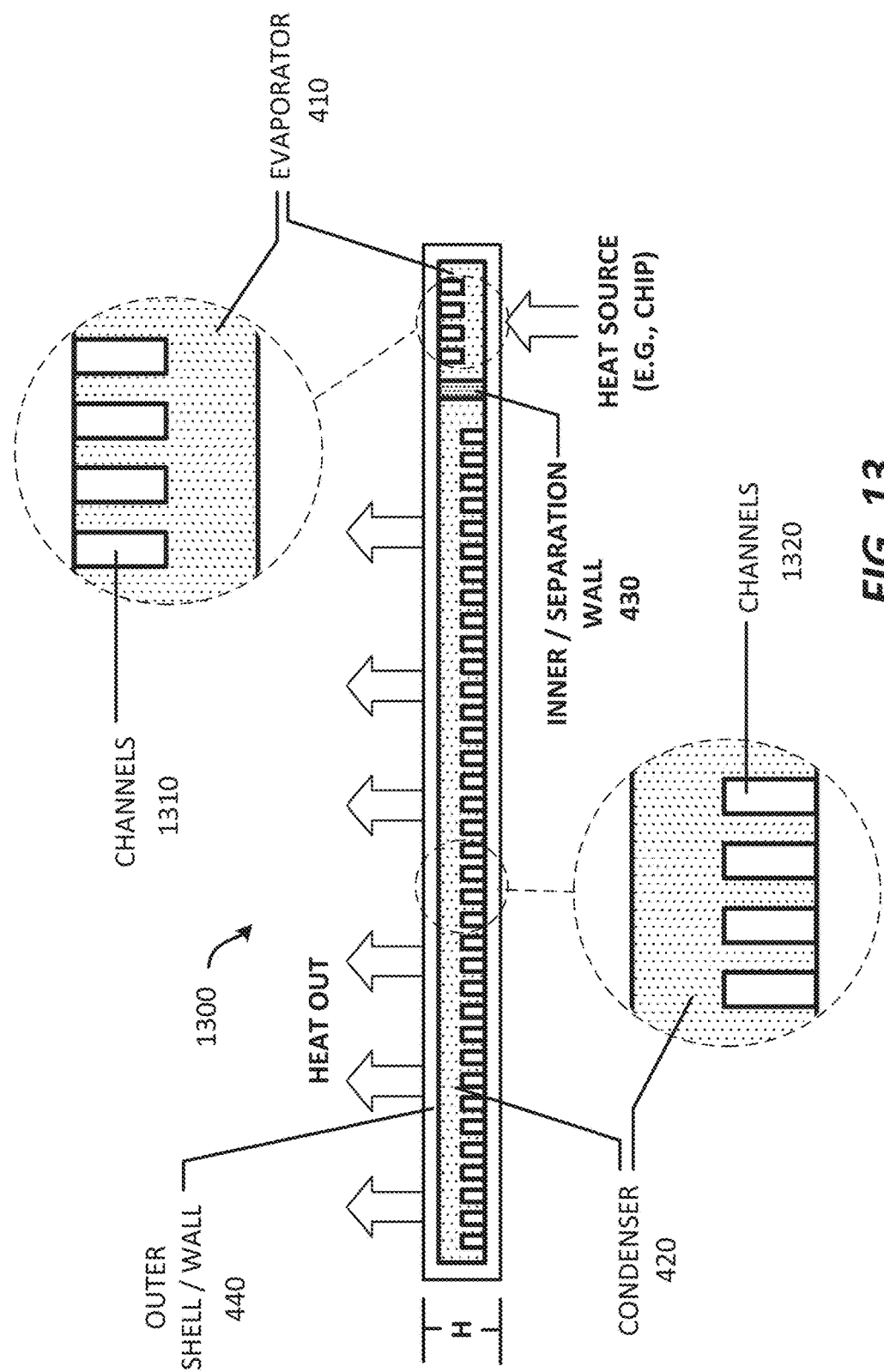
FIG. 13 illustrates a profile view of a heat dissipating device.

FIG. 13 illustrates a heat dissipating device 1300 that includes the evaporator 410, the condenser 420, the inner wall 430, and the outer shell 440. As shown in FIG. 13, the evaporator 410 includes channels 1310 (e.g., evaporator channel) in a thermally conductive element. The channels 1310 allow the fluid (e.g., fluid 470) to flow through. The channels 1310 are formed on an upper portion of the evaporator 410 and/or on an upper portion of the heat dissipating device 400. The channels 1310 may be defined by the outer shell 440.

The condenser 420 includes channels 1320 (e.g., condenser channels) in a thermally conductive element. The channels 1320 allow the fluid (e.g., evaporated fluid 1020 and condensing fluid 1030) to flow through. The channels 1320 are formed on a lower portion of the condenser 420 and/or a lower portion of the heat dissipating device 400. The channels 1320 may be defined by the outer shell 440.

Figure 14:
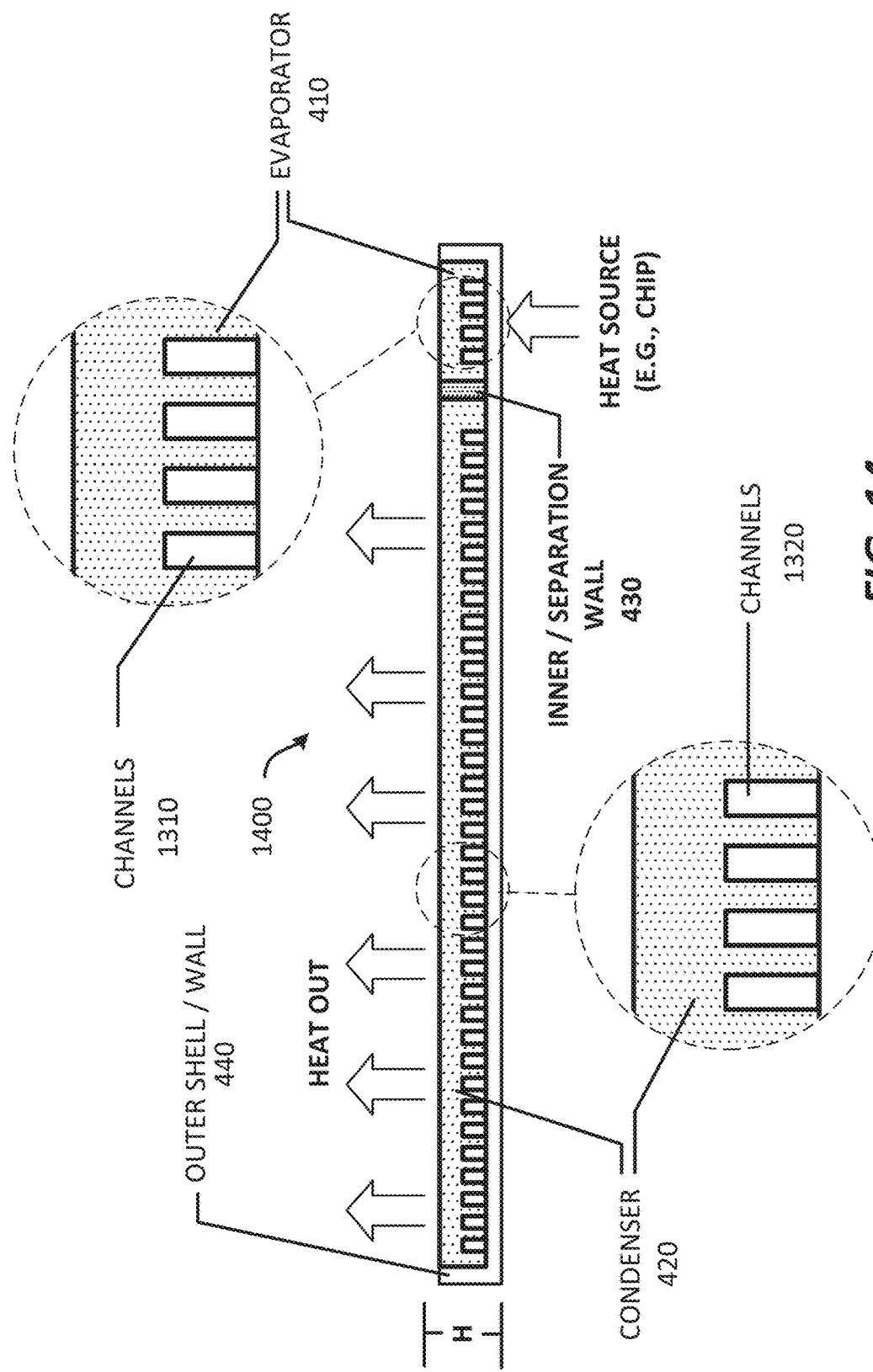
FIG. 14 illustrates a profile view of another heat dissipating device.

FIG. 14 illustrates a heat dissipating device 1400 that includes the evaporator 410, the condenser 420, the inner wall 430, and the outer shell 440. As shown in FIG. 14, the evaporator 410 includes channels 1310 (e.g., evaporator channel) in a thermally conductive element. The channels 1310 allow the fluid (e.g., fluid 470) to flow through. The channels 1310 are formed on a lower portion of the evaporator 410 and/or on a lower portion of the heat dissipating device 400. The channels 1310 may be defined by the outer shell 440.

The condenser 420 includes channels 1320 (e.g., condenser channels) in a thermally conductive element. The channels 1320 allow the fluid (e.g., evaporated fluid 1020 and condensing fluid 1030) to flow through. The channels 1320 are formed on a lower portion of the condenser 420 and/or a lower portion of the heat dissipating device 400. The channels 1320 may be defined by the outer shell 440.

Figure 15:
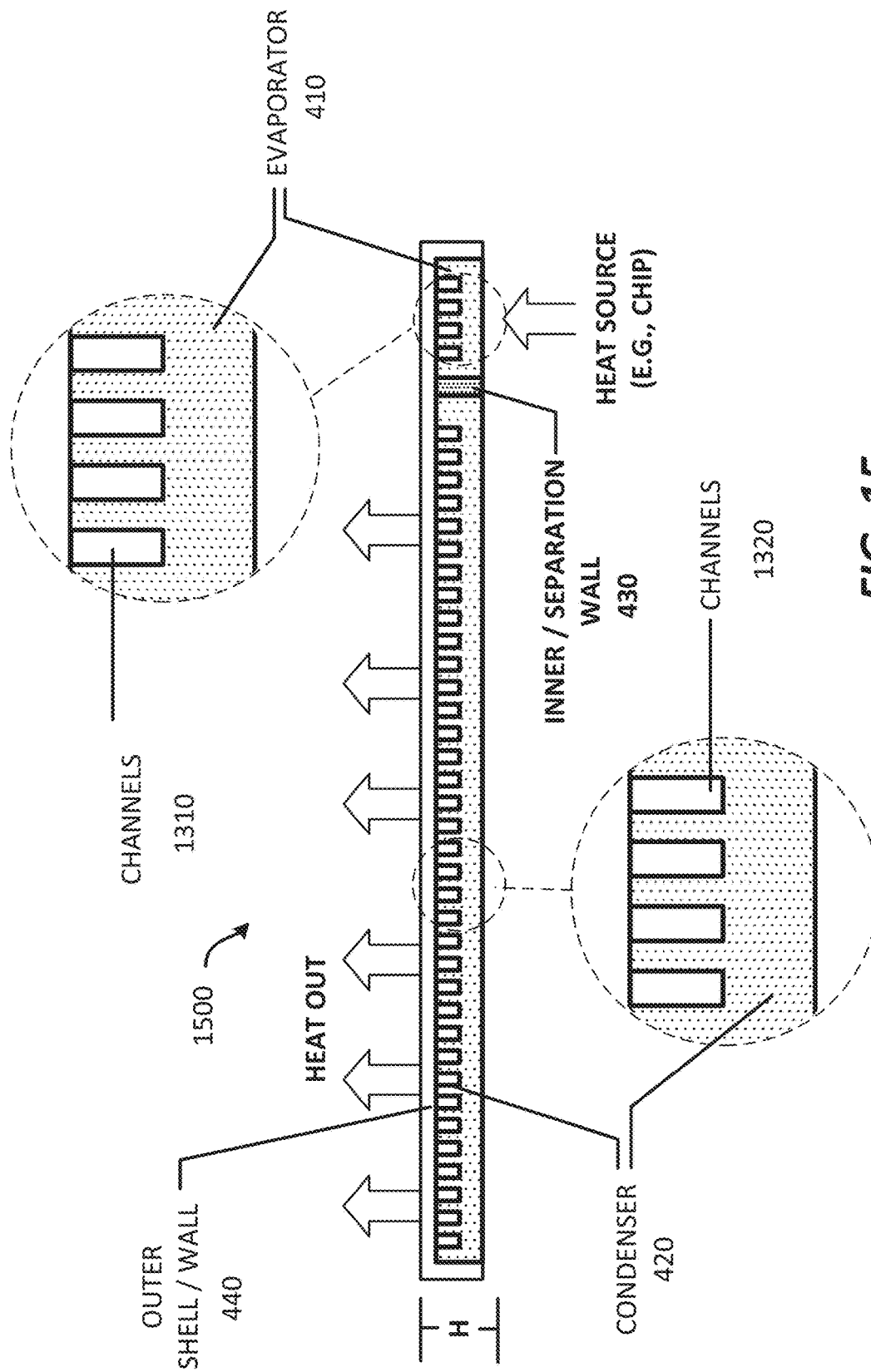
FIG. 15 illustrates a profile view of another heat dissipating device.

FIG. 15 illustrates a heat dissipating device 1500 that includes the evaporator 410, the condenser 420, the inner wall 430, and the outer shell 440. As shown in FIG. 15, the evaporator 410 includes channels 1310 (e.g., evaporator channel) in a thermally conductive element. The channels 1310 allow the fluid (e.g., fluid 470) to flow through. The channels 1310 are formed on an upper portion of the evaporator 410 and/or on an upper portion of the heat dissipating device 400. The channels 1310 may be defined by the outer shell 440.

The condenser 420 includes channels 1320 (e.g., condenser channels) in a thermally conductive element. The channels 1320 allow the fluid (e.g., evaporated fluid 1020 and condensing fluid 1030) to flow through. The channels 1320 are formed on an upper portion of the condenser 420 and/or an upper portion of the heat dissipating device 400. The channels 1320 may be defined by the outer shell 440.

Figure 16:
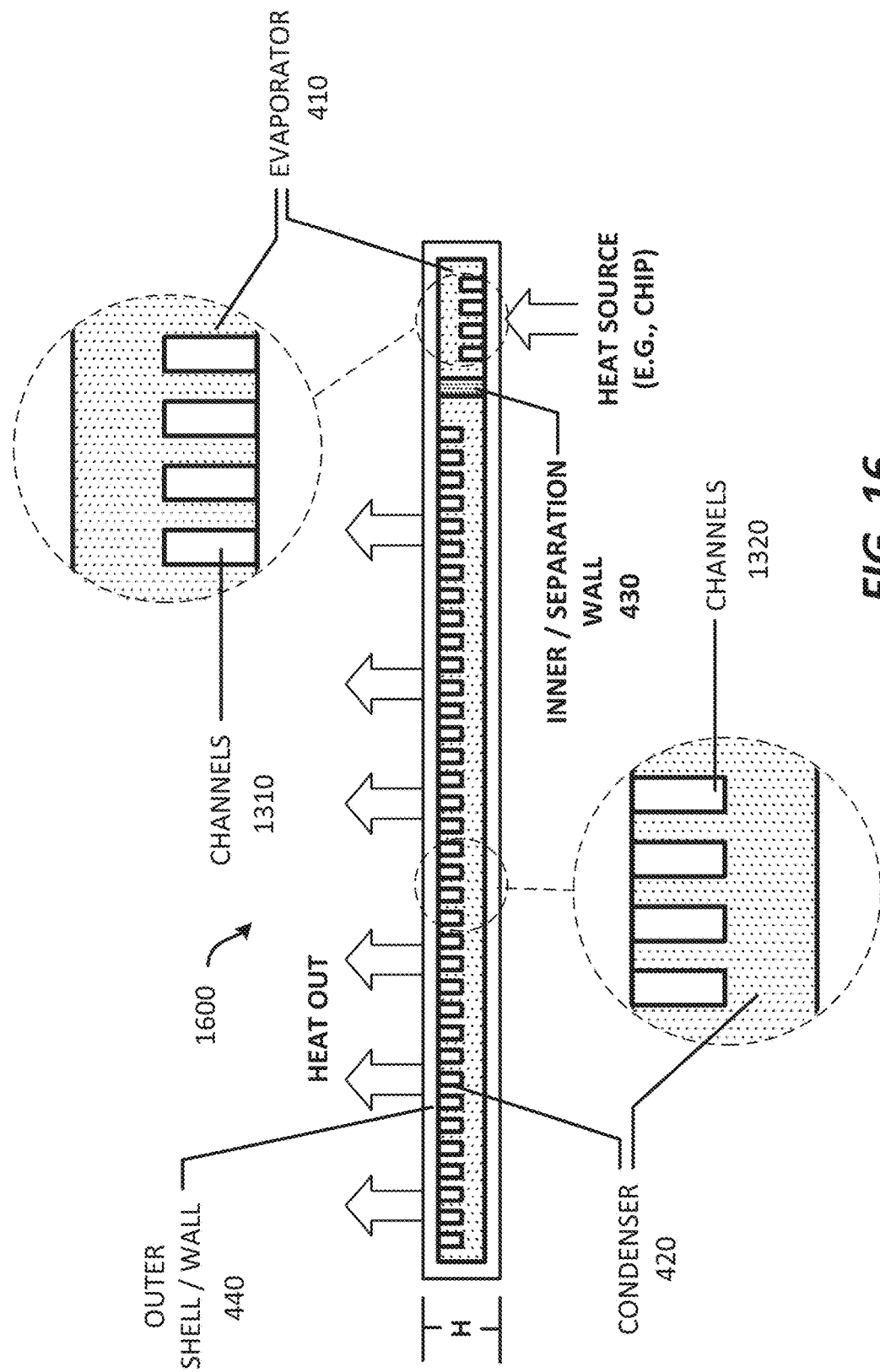
FIG. 16 illustrates a profile view of another heat dissipating device.

FIG. 16 illustrates a heat dissipating device 1600 that includes the evaporator 410, the condenser 420, the inner wall 430, and the outer shell 440. As shown in FIG. 16, the evaporator 410 includes channels 1310 (e.g., evaporator channel) in a thermally conductive element. The channels 1310 allow the fluid (e.g., fluid 470) to flow through. The channels 1310 are formed on a lower portion of the evaporator 410 and/or on a lower portion of the heat dissipating device 400. The channels 1310 may be defined by the outer shell 440.

The condenser 420 includes channels 1320 (e.g., condenser channels) in a thermally conductive element. The channels 1320 allow the fluid (e.g., evaporated fluid 1020 and condensing fluid 1030) to flow through. The channels 1320 are formed on an upper portion of the condenser 420 and/or an upper portion of the heat dissipating device 400. The channels 1320 may be defined by the outer shell 440.

Exemplary Thermally Conductive Elements Configured as Evaporator or Condenser

Figure 17:
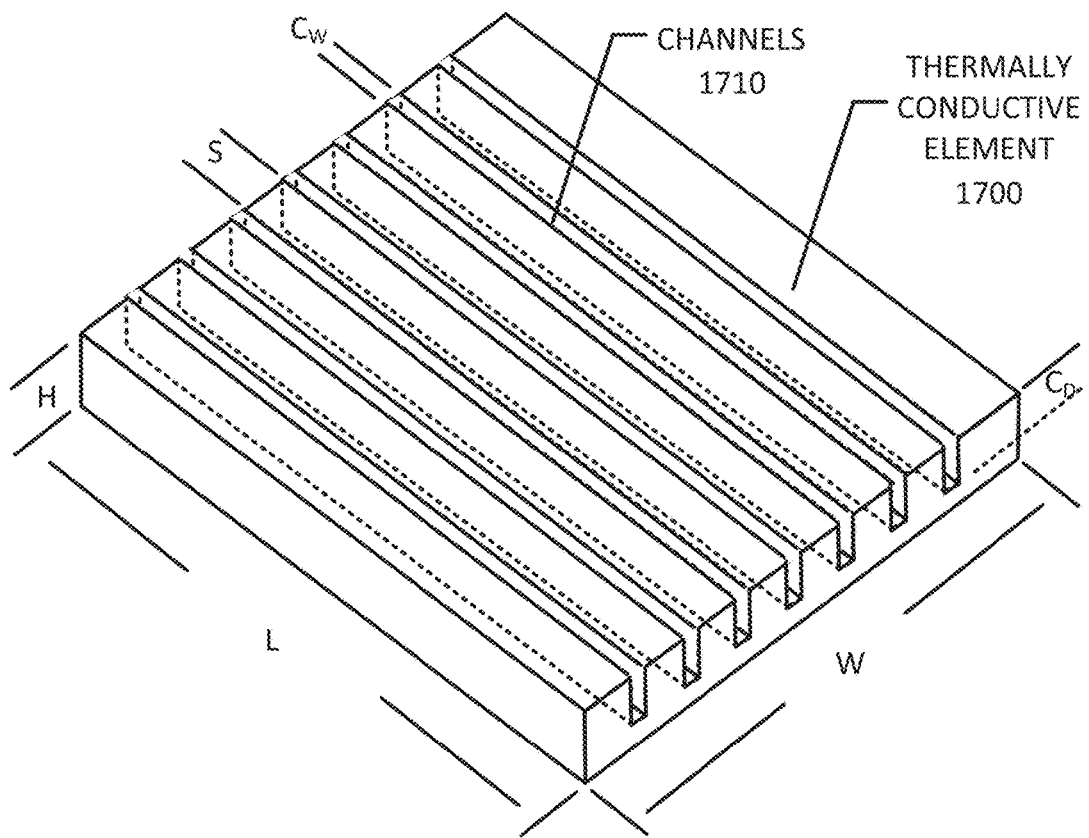
FIG. 17 illustrates an angled view of a thermally conductive element that is configured as an evaporator.
Figure 18:
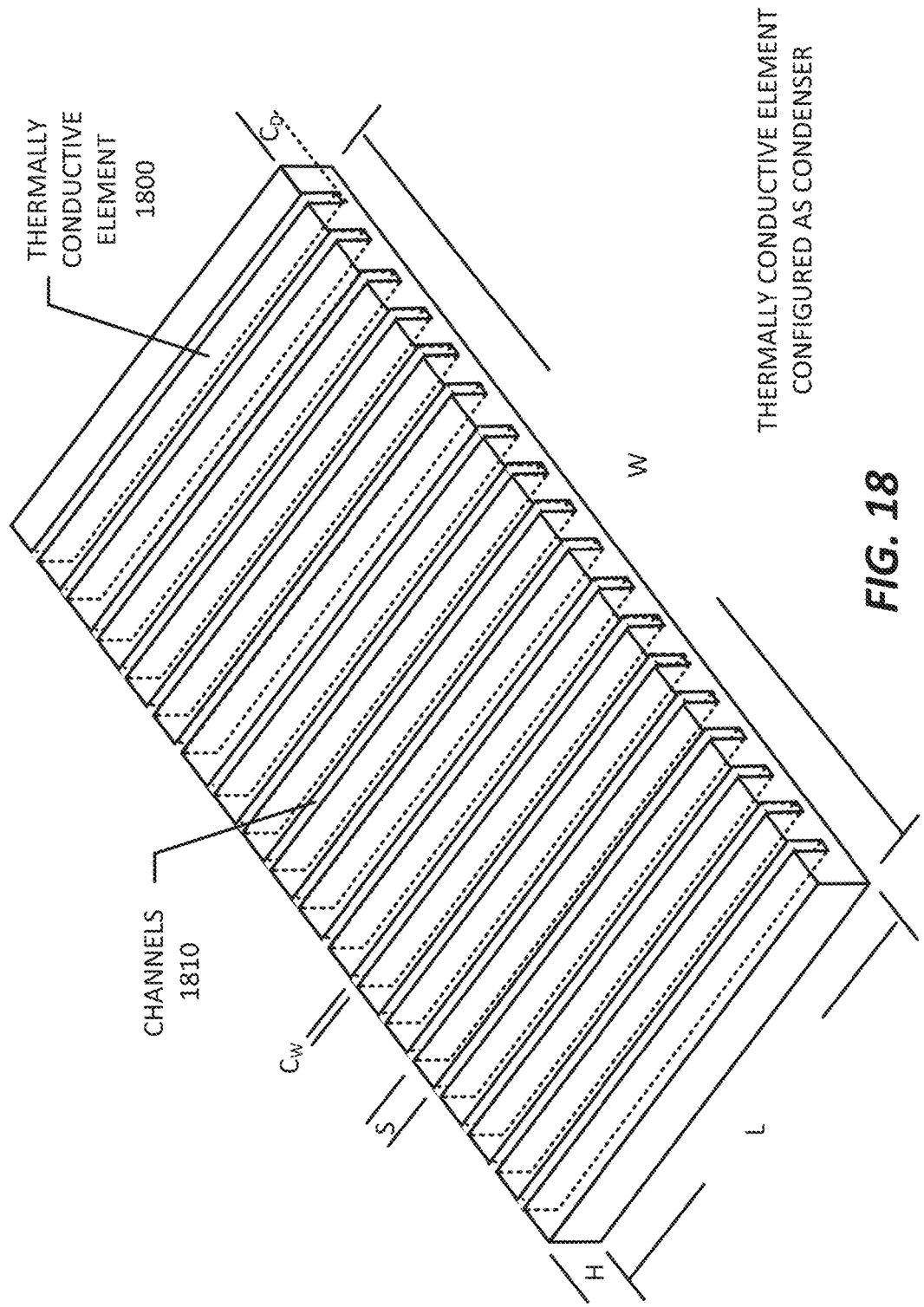
FIG. 18 illustrates an angled view of a thermally conductive element that is configured as a condenser.

FIG. 17 illustrates a thermally conductive element 1700 that can be configured to operate as an evaporator (e.g., evaporator 410) in a heat dissipating device. FIG. 18 illustrates a thermally conductive element 1800 that can be configured to operate as a condenser (e.g., condenser 420) in a heat dissipating device.

The thermally conductive element 1700 may be made of any of the materials described above in Table 1 and/or in other parts of the disclosure. The thermally conductive element 1700 includes a length (L), a width (W), and a height (H). The thermally conductive element 1700 includes a plurality of channels 1710 that travel along the length of the thermally conductive element 1700. One or more channels from the plurality of channels 1710 may have a width ($C_W$) and a depth ($C_D$). Two or more channels from the plurality of channels 1710 may be separated by a spacing (S).

In some implementations, when the thermally conductive element 1700 is configured to be an evaporator (e.g., evaporator 410), the thermally conductive element 1700 may measure about 20 mm (L)×15 mm (W)×450 microns (μm) (H). In some implementations, the channels 1710 of the thermally conductive element 1700 may be about 300 microns (μm) ($C_W$)×250 microns (μm) ($C_D$), when the thermally conductive element 1700 is configured as an evaporator. In some implementations, the dimensions of the channels are selected so that the pressure drop across the thermally conductive element 1700 (e.g., evaporator) is about 0.0049 bar or less.

In some implementations, when the thermally conductive element 1800 is configured to be a condenser (e.g., condenser 420), the thermally conductive element 1800 may measure about 20 mm (L)×120 mm (W)×450 microns (μm) (H). In some implementations, the channels 1810 of the thermally conductive element 1800 may be about 300 microns (μm) ($C_w$)×300 microns (μm) ($C_D$), when the thermally conductive element 1800 is configured as a condenser. In some implementations, the dimensions of the channels are selected so that the pressure drop across the thermally conductive element 1800 (e.g., condenser) is about 0.0002 bar or less.

The above dimensions are exemplary. Different implementations may use different dimensions.

Exemplary Sequence for Fabricating a Thermally Conductive Element

FIG. 19 (which includes 19A-19B) illustrates an exemplary sequence for fabricating a thermally conductive element that can be configured as an evaporator (e.g., evaporator 410) or a condenser (e.g., condenser 420) in a heat dissipating device. The sequence of FIG. 19 can be used to fabricate the thermally conductive element 1700 or thermally conductive element 1800. For the purpose of simplification, the sequence of FIG. 19 will be used to describe fabricating the thermally conductive element 1800.

Figure 19A:
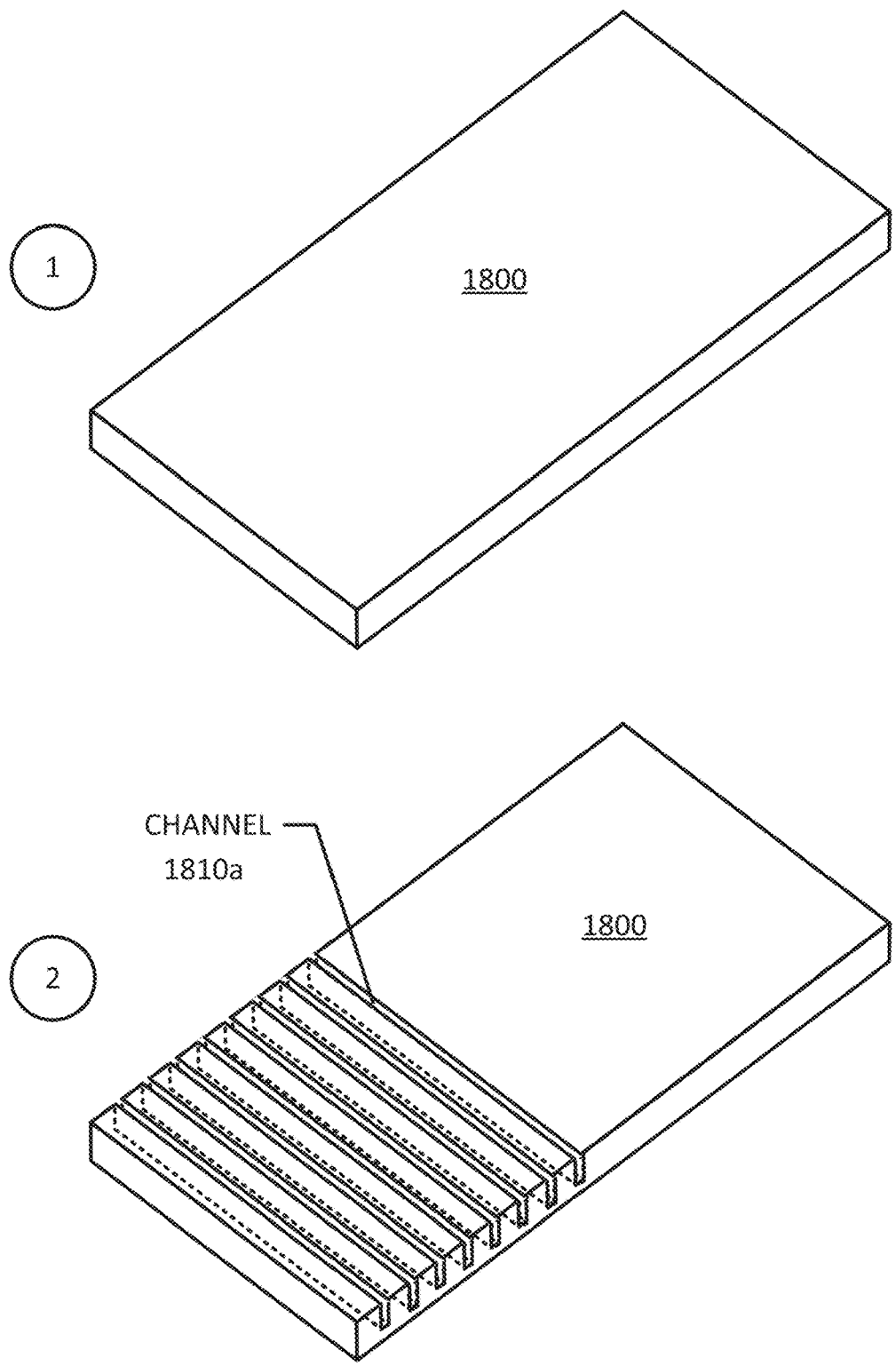
FIG. 19 (which includes FIGS. 19A-19B) illustrates a sequence for fabricating a thermally conductive element.

Stage 1 of FIG. 19A, illustrates a thermally conductive element 1800 that is provide (e.g., by a supplier) or fabricated. Different implementations may use different materials for the thermally conductive element 1800. Examples of materials for the thermally conductive element 1800 are listed in Table 1.

Stage 2 illustrates a first plurality of channels 1810a that are formed in the thermally conductive element 1800. The first plurality of channels 1810a may be micro channels that are formed by a plowing process or a micro bonding process. In some implementations, such processes can be used to form channels that have a width of about 300 microns ($\mu m$) and, a depth of about 250 microns ($\mu m$). However, different implementations may use different dimensions.

Figure 19B:
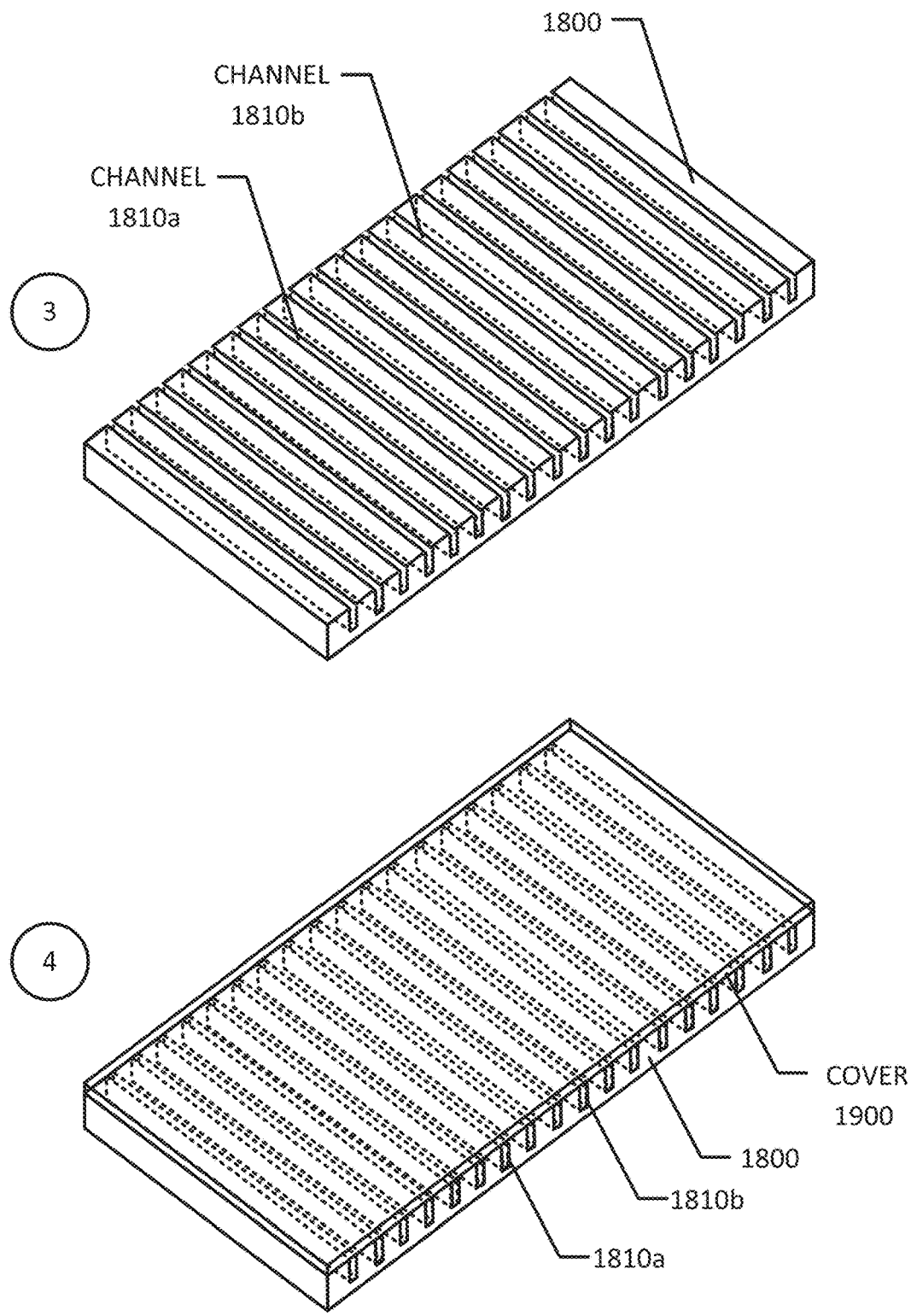

Stage 3 of FIG. 19B, illustrates a second plurality of channels 1810b that are formed in the thermally conductive element 1800. The second plurality of channels 1810b may be micro channels that are formed by a plowing process or a micro bonding process, as described above in Stage 2.

Stage 4 illustrates a cover 1900 that is optionally coupled to the thermally conductive element 1800 such the cover 1900 covers the first plurality of channels 1810a and the second plurality of channels 1810b. An adhesive or a welding process may be used to couple the cover 1900 to the thermally conductive element 1800. In some implementations, the cover 1900 may be optional. In some implementations, the cover 1900, the thermally conductive element 1800, the first plurality of channels 1810a and the second plurality of channels 1810b may be configured to operate as an evaporator (e.g., evaporator 410) or a condenser (e.g., condenser 420) for a heat dissipating device.

The cover 1900 is optional because in some implementations, the outer shell 440 may act as the cover for the thermally conductive element (e.g., 1700, 1800).

Exemplary Device Comprising Heat Dissipating Device

Figure 20:
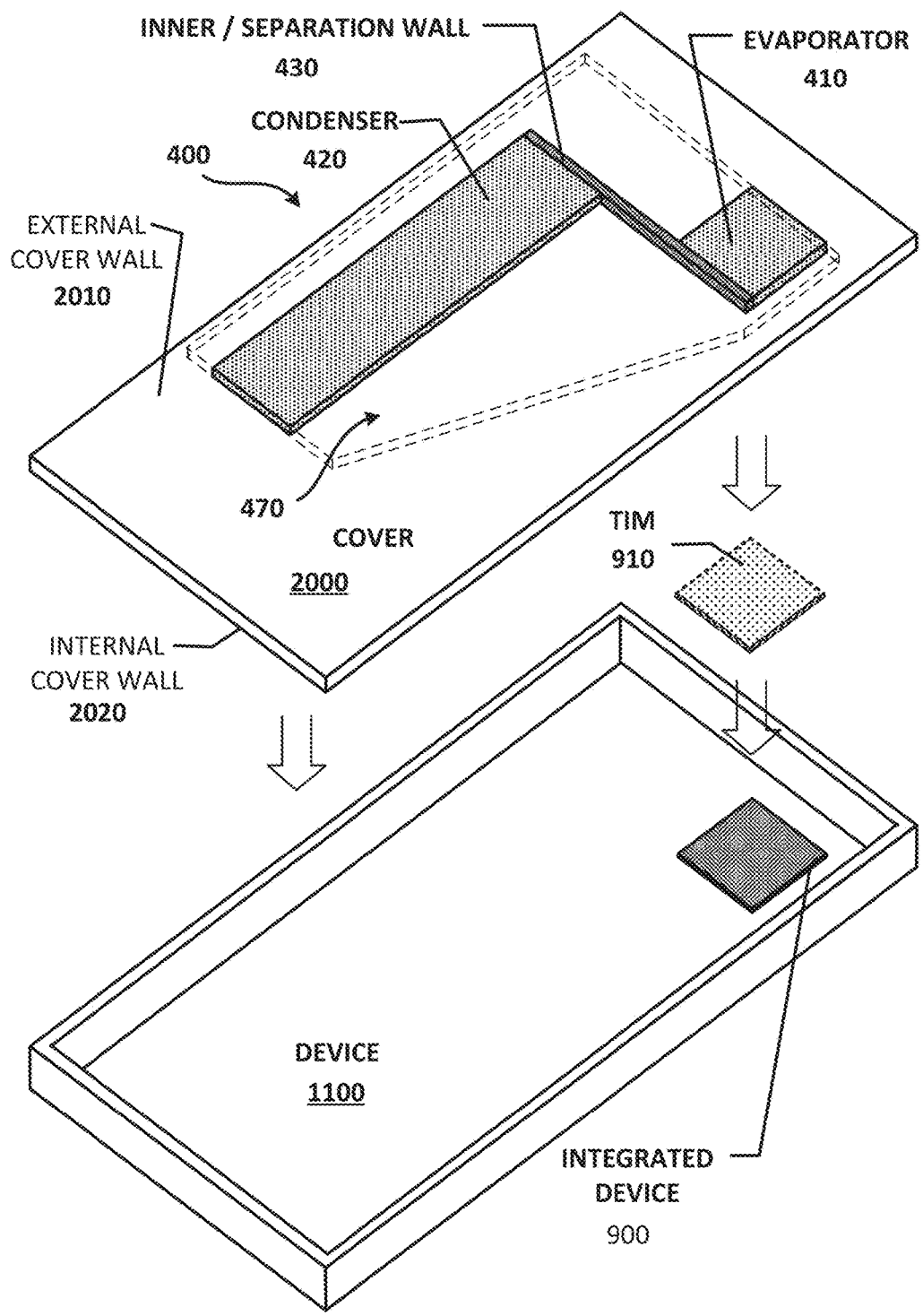
FIG. 20 illustrates an assembly view of a cover comprising a heat dissipating device being coupled to a device.

In some implementations, the heat dissipating device may be integrated in a cover and then the cover is coupled to a mobile device. FIG. 20 illustrates an assembly view of a device 1100 (e.g., mobile device) and a cover 2000. The cover 2000 includes the heat dissipating device 400, an external cover wall 2010 and an internal cover wall 2020. The internal cover wall 2020 may be optional. As will be further described below, the cover 2000 may be a shell that encapsulates the heat dissipating device 400. The shell may be filled or unfilled with a material (e.g., plastic) to form the cover 2000. The cover 2000 may be solid cover or a hollow cover.

The device 1100 includes the integrated device 900 and the thermal interface material (TIM) 910. The device 1100 may optionally include a device wall (not shown). The device 1100 may be a mobile device (e.g., phone, tablet).

As shown in FIG. 20, the heat dissipating device 400 includes the evaporator 410, the condenser 420, the inner wall 430, the outer shell 440, the evaporation portion 450, the collection portion 460, and the fluid 470. The heat dissipating device 400 is integrated in the cover 2000.

As shown in FIG. 20, the integrated device 900 is coupled to the thermal interface material (TIM) 910, which is coupled to the heat dissipating device 400 (which is located in the cover 2000). In particular, the heat dissipating device 400 is coupled to a portion of the outer shell 440 that is nearest the evaporator 410.

Figure 21:
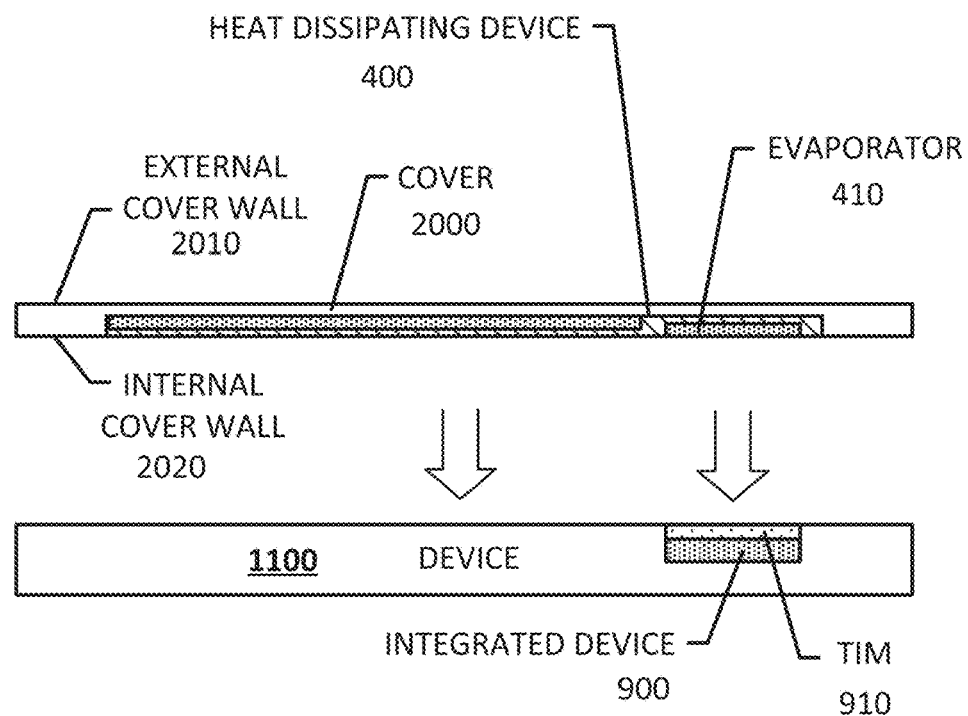
FIG. 21 illustrates a profile view of a cover comprising a heat dissipating device being coupled to a device.
Figure 22:
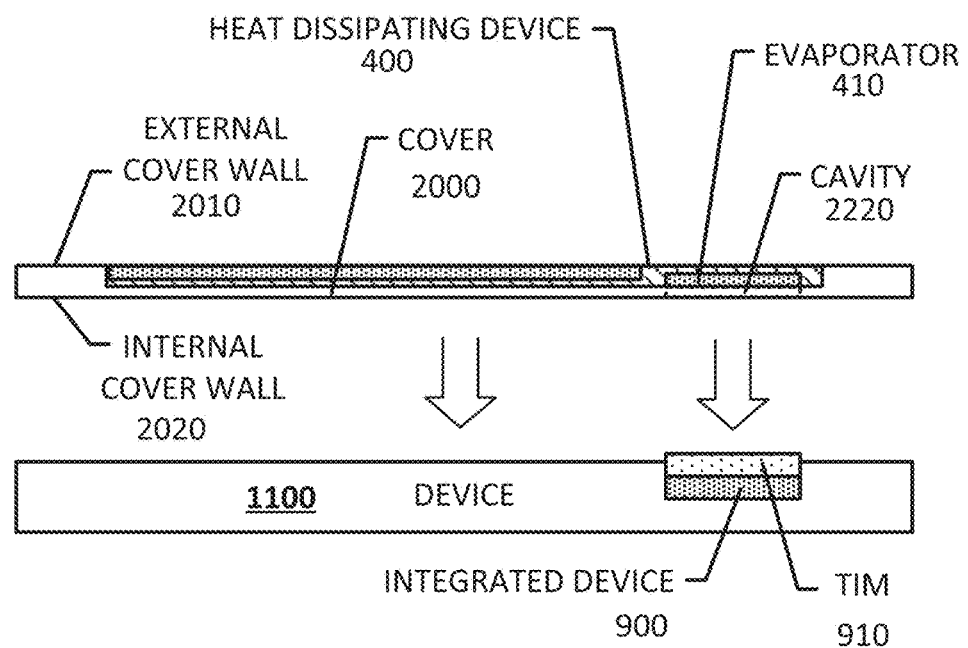
FIG. 22 illustrates a profile view of another cover comprising a heat dissipating device being coupled to a device.

FIGS. 21 and 22 illustrate examples of different covers being coupled to a device. FIG. 21 illustrates the cover 2000 that includes the heat dissipating device 400. As shown in FIG. 21, a surface of the heat dissipating device 400 is substantially aligned or substantially co-planar with the surface of the internal cover wall 2020 of the cover 2000. The cover 2000 is coupled to device 1100 such that the evaporator 410 is coupled to the thermal interface material (TIM) 910. As shown in FIG. 21, the thermal interface material (TIM) 910 is coupled to the integrated device 900.

FIG. 22 illustrates the cover 2000 that includes the heat dissipating device 400, where a surface of the heat dissipating device 400 is substantially aligned with a surface of the external cover wall 2010. FIG. 22 also illustrates that a surface of the heat dissipating device 400 is not aligned with the internal cover wall 2020 of the cover 2000. As shown in FIG. 22, the cover 2000 includes a cavity 2220 over the evaporator 410. As shown in FIG. 22, the cover 2000 is coupled to the device 1100 such that the evaporator 410 is coupled to the thermal interface material (TIM) 910 through the cavity 2220 of the cover 2000. The thermal interface material (TIM) 910 is coupled to the integrated device 900.

Figure 23:
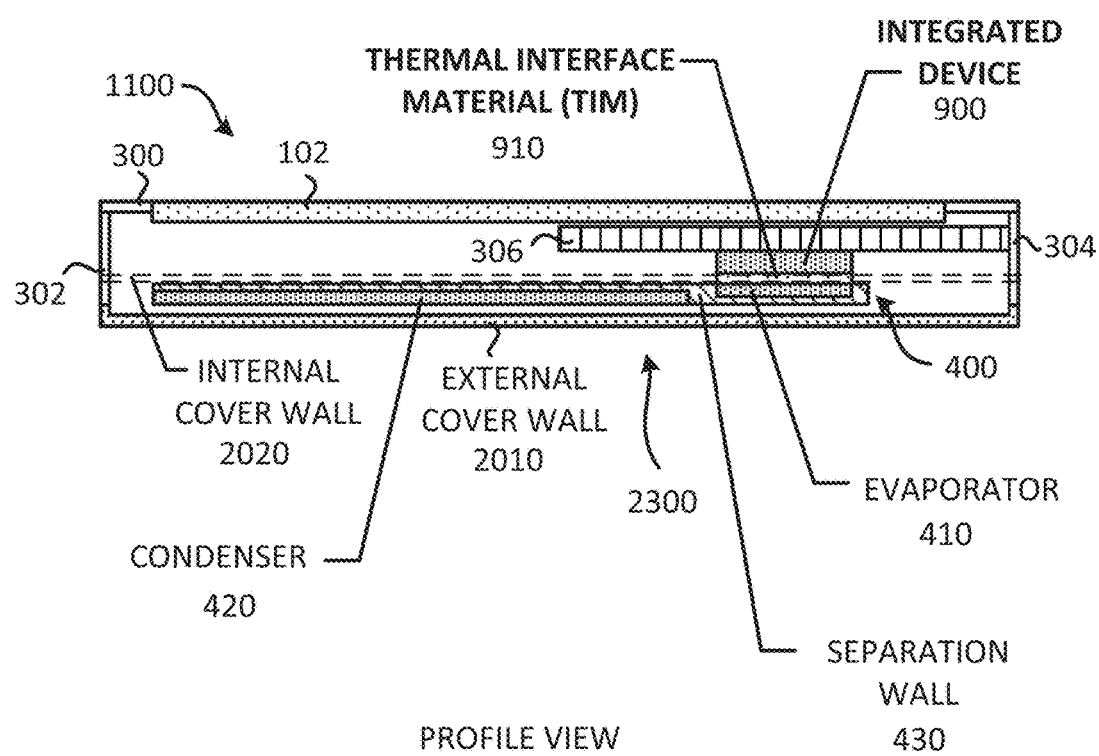
FIG. 23 illustrates a profile view of a cover comprising a heat dissipating device coupled to a device.

FIG. 23 illustrates a profile view of the cover 2000 coupled to the device 1100. The device 1100 includes the display 102, the cover 2000 (which includes external cover wall 2010 and/or internal cover wall 2020), the front side surface 300, the bottom side surface 302, and the top side surface 304. FIG. 23 also illustrates a printed circuit board (PCB) 306, the integrated device 900, the thermal interface material (TIM) 910. In some implementations, the internal cover wall 2020 is optional.

FIG. 23 illustrates that the heat dissipating device 400 is not touching the external cover wall 2010 of the cover 2000. However, in some implementations, the heat dissipating device 400 may touch the external cover wall 2010. In some implementations, a heat spreader is between the heat dissipating device 400 and the external cover wall.

Exemplary Sequence for Fabricating a Cover Comprising a Heat Dissipating Device

Figure 24:
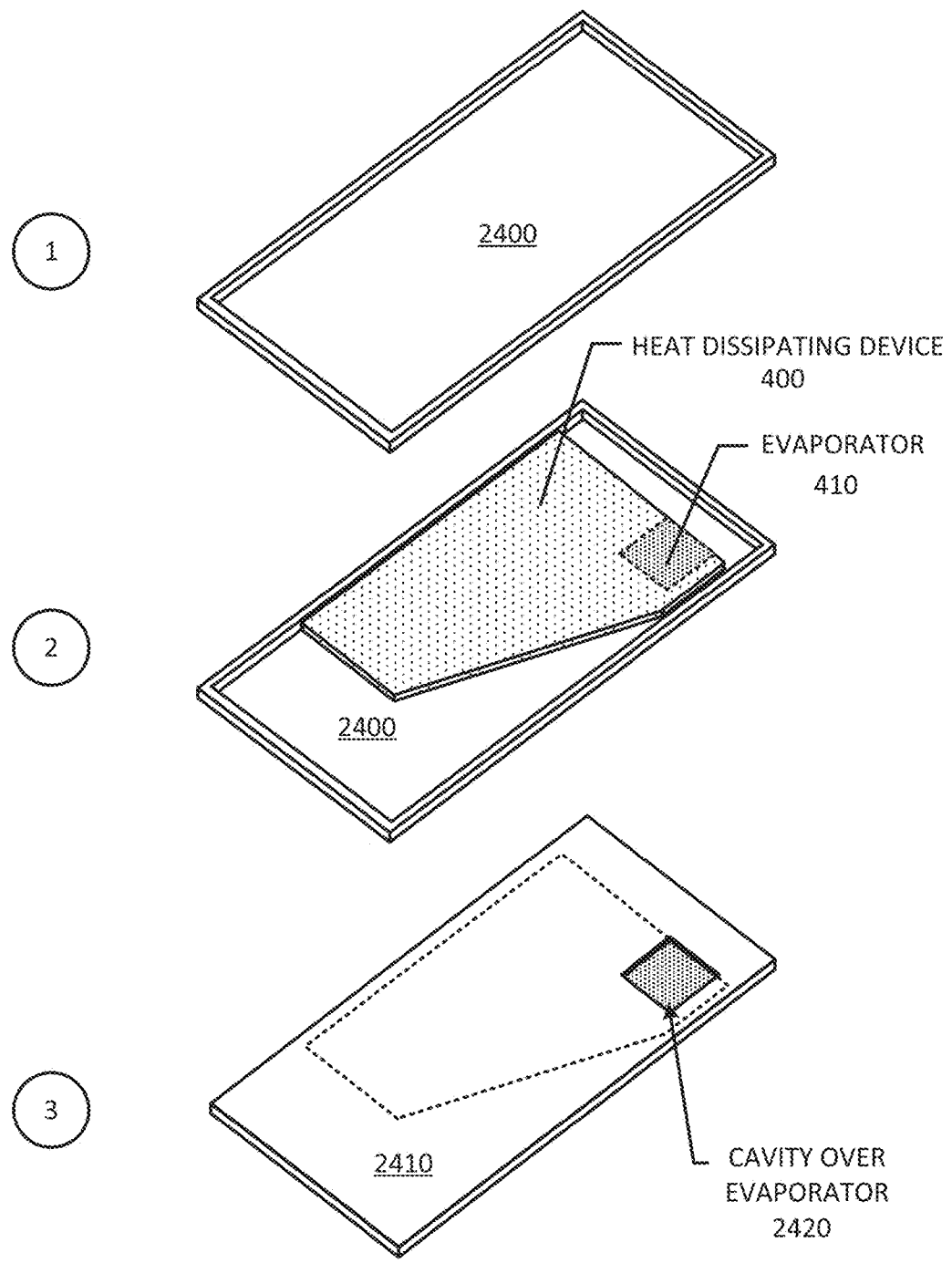
FIG. 24 illustrates a sequence for fabricating a cover comprising a heat dissipating device.

FIG. 24 illustrates an exemplary sequence for fabricating a cover that includes a heat dissipating device. In some implementations, the sequence can be used to fabricate the cover 2000 that includes the heat dissipating device 400.

Stage 1 of FIG. 24, illustrates a cover 2400 that is provided. The cover 2400 may be a shell that includes an external cover wall (e.g., 2010). The cover 2400 has a cavity.

Stage 2 illustrates a heat dissipating device 400 that is placed in the cover 2400. Different implementations may place the heat dissipating device 400 in the cover 2400 differently.

Stage 3 illustrates a layer 2410 over the heat dissipating device 400. The layer 2410 may be used as an internal cover wall (e.g., 2020). The layer 2410 includes a cavity 2220 over the evaporator 410 of the heat dissipating device 400. The cavity 2220 exposes the evaporator 410. The cavity 2220 may include a thermal interface material (TIM) 910, when the cover 2000 is coupled to a device.

In some implementations, the layer 2410 may be a fill material (e.g., plastic) that fills portions of the cover 2400 that is not occupied by the heat dissipating device 400. In some implementations, the layer 2410 is provided such that a surface of the heat dissipating device 400 is substantially aligned or substantially co-planar with a surface of the cover, as shown in FIG. 21. In some implementations, no cover is provided.

Exemplary Heat Dissipating Devices

In some implementations, the fluid inside the heat dissipating device is heated to very high pressures. High pressures can be problematic and very dangerous because it can result in the heat dissipating device cracking and/or rupturing. Thus, it is important that the heat dissipating device can withstand very internal high pressures (e.g., about 6 bars or greater). The high pressure values will vary based on the different fluids (e.g., refrigerant) used.

Figure 25:
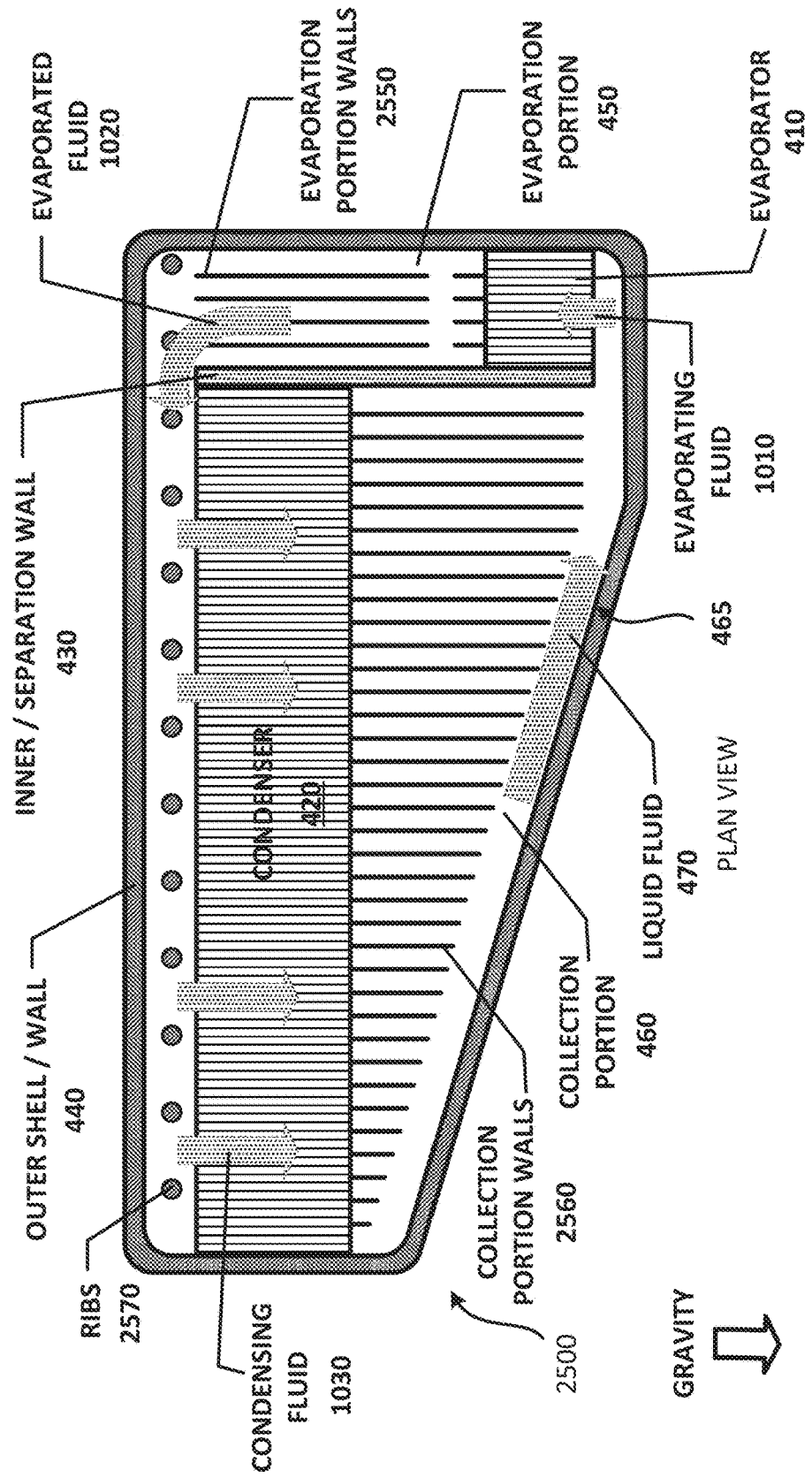
FIG. 25 illustrates a view of a heat dissipating device comprising ribs and walls for providing structural support.

FIG. 25 illustrates an example of a heat dissipating device 2500 that can withstand high internal pressures. The heat dissipating device 2500 includes components and/or structure that are configured to provide structural support for the heat dissipating device. The heat dissipating device 2500 is similar to the heat dissipating device 400, and thus includes similar components as the heat dissipating device 400. The heat dissipating device 2500 also includes one or more evaporation portion walls 2550, one or more collection portion walls 2560 and a plurality of ribs 2570. The fluid (e.g., evaporated fluid 1020) may travel along or through the one or more evaporation portion walls 2550 and a plurality of ribs 2570. The fluid (e.g., fluid 470) may travel along or through the one or more collection portion walls 2560. The heat dissipating device 2500 operates in a similar manner as the heat dissipating device 400, but can operate at higher internal pressures (e.g., about 6 bars or greater).

The one or more evaporation portion walls 2550, the one or more collection portion walls 2560 and/or the plurality of ribs 2570 are configured to provide additional coupling between the first shell 500 and the second shell 510 of the outer shell 440, thus provide additional structural support to withstand high internal pressures. In some implementations, the one or more evaporation portion walls 2550, the one or more collection portion walls 2560 and/or the plurality of ribs 2570 provide a heat dissipating device 2500 that can withstand about 6 bars or more, of internal pressure inside the heat dissipating device 2500.

FIG. 25 also illustrates that the evaporation portion walls 2550 subdivide the evaporation portion 450, and the collection portion walls 2560 subdivide the collection portion 460. In some implementations, the flow of the fluid inside the heat dissipating device 2500 is similar to the flow of the fluid inside the heat dissipating device 400. The heat dissipating device 2500 may be a cooling device that provides heat dissipation through recirculation of a fluid in the outer shell 440 without the need of a pump or compressor.

FIG. 25 illustrates the fluid 470 in the collection portion 460 of the heat dissipating device 2500. The collection portion 460 includes the collection portion walls 2560. The collection portion 460 has an angled portion (e.g., 465) so that the fluid 470 (which is in liquid form) flows down (e.g., due to gravity) towards the evaporator 410. The evaporator 410 is being heated by a heat generating region (e.g., region comprising a TIM and/or an integrated device).

As the fluid 470 enters the evaporator 410 and travels through the evaporator 410, the fluid 470 becomes an evaporating fluid 1010 due to the heat from the evaporator 410. Once the evaporating fluid 1010 exits the evaporator 410, the evaporating fluid 1010 becomes an evaporated fluid 1020 (e.g., vapor fluid) that travels through the evaporation portion 450 (e.g., along the evaporation portion walls 2550 and/or ribs 2570) towards the condenser 420. The evaporated fluid 1020 may include fluid in a gas phase and some fluid in liquid phase.

As the evaporated fluid 1020 (e.g., vapor fluid) enters the condenser 420 and travels through the condenser 420, the evaporated fluid 1020 becomes a condensing fluid 1030. This process takes heat away from the evaporated fluid 1020 and into the condenser 420. The heat from the condenser 420 escapes out of the heat dissipating device 2500. Once the condensing fluid 1030 exits the condenser, the condensing fluid 1030 returns to (e.g., via gravity) the collection portion 460 (e.g., along the collection portion walls 2560) as the fluid 470 (e.g., condensed fluid), in liquid phase, and the cycle repeats itself.

In some implementations, as long as the evaporator 410 is being heated by an external heat source or heat generating region, the fluid 470 will cycle through the heat dissipating device 2500 in a manner as described above.

In some implementations, the heat dissipating device 2500 operates optimally when the heat dissipating device 2500 is arranged such that the evaporator 410 is located lower than the condenser 420, so as to take advantage of gravity pulling the fluid 470 towards the evaporator 410 (e.g., without the need of a pump or compressor). As mentioned above, gravity may provide the force that returns the condensed fluid to the collection portion.

It is noted that different implementations may provide a heat dissipating device with different shapes, designs and/or configurations. For example, the evaporator 410 may include one or more evaporators. Similarly, the condenser 420 may include one more condensers. Other features may be implemented to improve the heat dissipating capabilities of the heat dissipating device.

Figure 26:
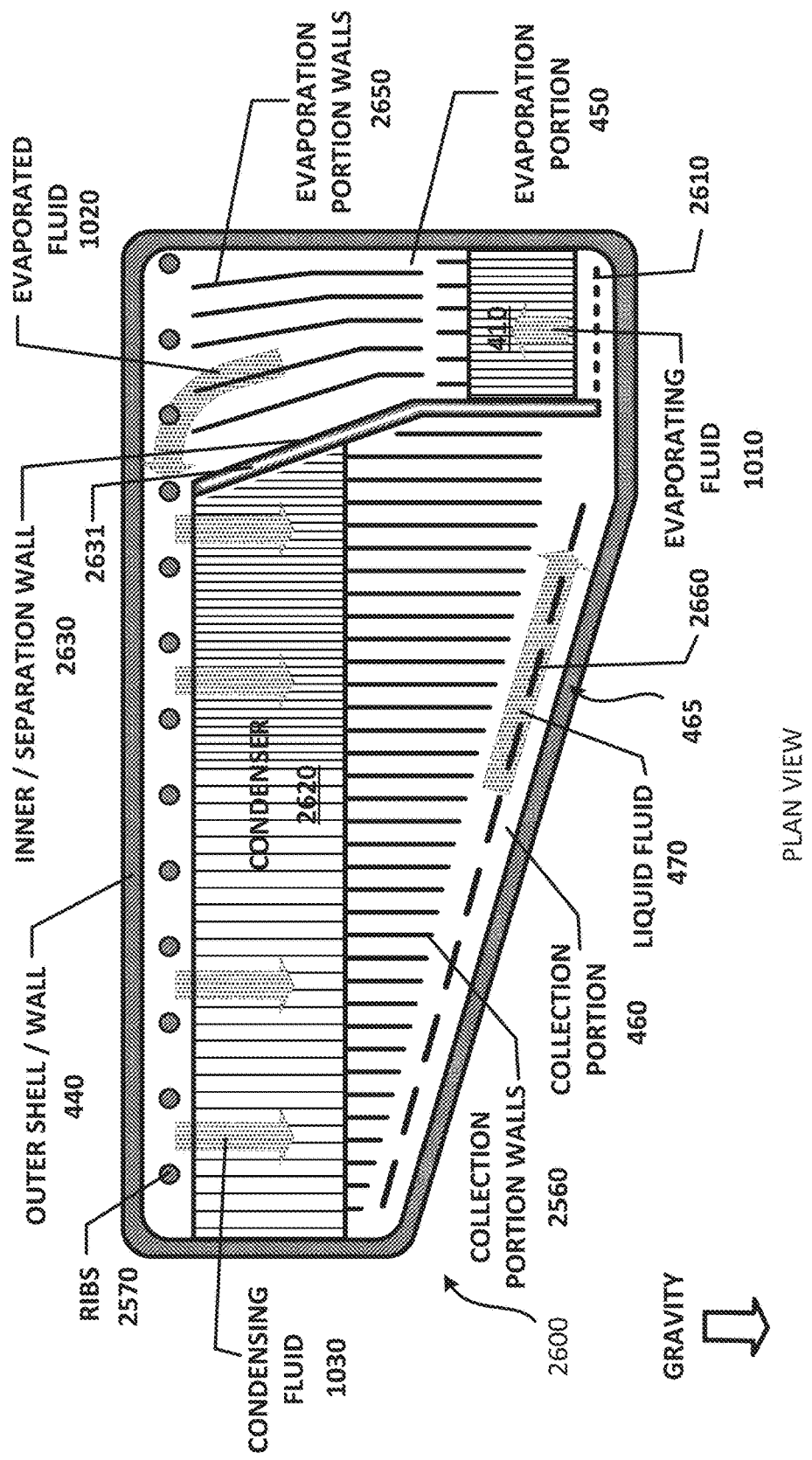
FIG. 26 illustrates a view of a heat dissipating device comprising ribs, separation walls, and walls for providing structural support.

FIG. 26 illustrates an example of a heat dissipating device 2600 with improved heat dissipating capabilities. The heat dissipating device 2600 includes components and/or structure that are configured to provide structural support for the heat dissipating device, reduce fluid pressure drops in the device, break and prevent bubbles from entering into particular component(s), provide improved fluid flow, provide better heat isolation between different areas of the device, and improve overall utilization of the space in the device. The heat dissipating device 2600 is similar to the heat dissipating devices 400 and 2500, and thus includes similar components as the heat dissipating devices 400 and 2500. The heat dissipating device 2600 includes components and structures that are arranged differently than what is described in other parts of the disclosure. However, different implementations may use different combinations of the features described in the disclosure.

The heat dissipating device 2600 includes one or more barriers 2610, one or more evaporation portion walls 2650, an inner wall 2630 (e.g., separation wall), one or more support walls 2660, one or more collection portion walls 2560, a plurality of ribs 2570, and a condenser 2620 that includes variable width channels.

The fluid (e.g., evaporated fluid 1020) may travel along or through the one or more evaporation portion walls 2650 and a plurality of ribs 2570. The fluid (e.g., fluid 470) may travel through the condenser 2620 and along or through the one or more collection portion walls 2560. The heat dissipating device 2600 operates in a similar manner as the heat dissipating device 400 and/or the heat dissipating device 2500, but can operate with improved heat dissipating capabilities.

The one or more evaporation portion walls 2650 are configured to provide lower fluid pressure drops through the evaporation portion 450, which improves fluid flow and thus provide better heat dissipating capabilities. The reduction in fluid pressure drops is achieved by providing angled or slanted walls (e.g., relative to the other walls of the heat dissipating device 2600) for the evaporation portion walls 2650. In some implementations, the evaporation portion walls 2650 are non-orthogonal evaporation portion walls 2650. In some implementations, the one or more evaporation portion walls 2650 includes portions that are straight, angled, slanted, orthogonal, non-orthogonal, offset and/or staggered. In some implementations, the use of offset and/or staggered evaporation portion walls 2650 helps break up bubbles that may travel through the evaporation portion 450. Breaking up the bubbles and/or reducing the bubbles helps improve the flow of the evaporated fluid 1020, which increases the heat dissipating capabilities of the heat dissipating device 2600. The one or more evaporation portion walls 2650 are further described in FIG. 27.

The inner wall 2630 (e.g., separation wall) may also be angled, slanted, non-orthogonal and/or include a portion that is straight, angled, slanted, orthogonal, and/or non-orthogonal. In addition, the inner wall 2630 may include a double wall. The inner wall 2630 may include a cavity 2631. The cavity 2631 may be inside the inner wall 2630. The cavity 2631 may be empty, in a vacuum, may include a low thermal conductivity material (e.g., relative to the inner wall 2630) or may include a gas (e.g., inert gas). The inner wall 2630 that includes the cavity 2631 is configured to operate as an isolation layer or isolation barrier to prevent or minimize heat from the evaporation portion 450 and/or the evaporator 410, from traveling through the inner wall 2630 and into the collection portion 460. The inner wall 2630 is also configured to prevent fluids from mixing.

The condenser 2620 includes a plurality of channels with variable widths. Different portions of the condenser 2620 may include channels with a first width, a second width, a third width, etc. . . . In some implementations, channels that are closer to the inner wall 2630 have a smaller width than channels that are farther away from the inner wall 2630. In some implementations, the use of channels with variable widths helps direct the flow of the fluid so that more of the condenser 2620 is utilized to condensate the fluid. Instead of the evaporated fluid 1020 traveling through the channels that are close to the inner wall 2630, the evaporated fluid 1020 will also travel through channels that are farther away from the inner wall 2630. Examples of channels (e.g., 1320) are described in FIGS. 13-18. The condenser 2620 that includes channels with variable widths is further described in FIG. 27.

The one or more support walls 2660 are configured to provide additional coupling between the first shell 500 and the second shell 510 of the outer shell 440, and thus provides additional structure support to withstand high internal pressure. The one or more support walls 2660 are located in the collection portion 460 near the collection portion walls 2560 and an angled portion (e.g., 465). The one or more support walls 2660 may be configured to break and/or reduce bubbles in the collection portion 460. Breaking up the bubbles and/or reducing the bubbles helps improve the flow of the fluid 470, which increases the heat dissipating capabilities of the heat dissipating device 2600.

The one or more barriers 2610 are located near the evaporator 410. There is spacing between the one or more barriers 2610 that allows the fluid 470 to travel through. The one or more barriers 2610 are configured to prevent bubbles from entering the evaporator 410 and/or breaking bubbles in the fluid 470 before the fluid 470 enters the evaporator 410. The one or more barriers 2610 may be walls. The one or more barriers 2610 may be configured to break and/or reduce bubbles from the collection portion 460. Breaking up the bubbles and/or reducing the bubbles helps improve the flow of the fluid 470 into the evaporator 410, which increases the heat dissipating capabilities of the heat dissipating device 2600. The barriers 2610 may be a means for bubble breaking.

In some implementations, the one or more evaporation portion walls 2650, the one or more collection portion walls 2560, the plurality of ribs 2570, the one or more barriers 2610, and/or the one or more support walls 2660 are configured to provide additional coupling between the first shell 500 and the second shell 510 of the outer shell 440, thus provide additional structural support to withstand high internal pressure. In some implementations, the one or more evaporation portion walls 2650, the one or more collection portion walls 2560, the plurality of ribs 2570, the one or more barriers 2610, and/or the one or more support walls 2660 provide a heat dissipating device 2600 that can withstand about 6 bars or more, of internal pressure inside the heat dissipating device 2600.

FIG. 26 also illustrates that the evaporation portion walls 2650 subdivide the evaporation portion 450, and the collection portion walls 2560 subdivide the collection portion 460. In some implementations, the flow of the fluid inside the heat dissipating device 2600 is similar to the flow of the fluid inside the heat dissipating device 2500. The heat dissipating device 2600 may be a cooling device that provides heat dissipation through recirculation of a fluid in the outer shell 440 without the need of a pump or compressor.

FIG. 26 illustrates the fluid 470 in the collection portion 460 of the heat dissipating device 2600. The collection portion 460 includes the collection portion walls 2560. The collection portion 460 has an angled portion (e.g., 465) so that the fluid 470 (which is in liquid form) flows down (e.g., due to gravity) towards the evaporator 410. In some implementations, before entering the evaporator 410, the fluid 470 travels through one or more barriers 2610, which may break up bubbles in the fluid 470 or prevent bubbles in the fluid 470 from entering the evaporator 410. The evaporator 410 is being heated by a heat generating region (e.g., region comprising a TIM and/or an integrated device).

As the fluid 470 enters the evaporator 410 and travels through the evaporator 410, the fluid 470 becomes an evaporating fluid 1010 due to the heat from the evaporator 410. Once the evaporating fluid 1010 exits the evaporator 410, the evaporating fluid 1010 becomes an evaporated fluid 1020 (e.g., vapor fluid) that travels through the evaporation portion 450 (e.g., along the evaporation portion walls 2650 and/or ribs 2570) towards the condenser 2620. The evaporation portion walls 2650 are offset or staggered, which helps break up bubbles in the evaporated fluid 1020. The evaporation portion walls 2650 are angled in such a way as to reduce the pressure drop of the evaporated fluid 1020 as it travels through the evaporation portion 450. The angled portions of the walls 2650 reduces, minimizes and/or eliminates right angles in the heat dissipating device 2600, and thus help the evaporated fluid 1020 flow more efficiently. The evaporated fluid 1020 may include fluid in a gas phase and some fluid in liquid phase.

As the evaporated fluid 1020 (e.g., vapor fluid) enters the condenser 2620 and travels through the condenser 2620, the evaporated fluid 1020 becomes a condensing fluid 1030. The different widths (e.g., variable widths) of the channels of the condenser 2620 help direct some of evaporated fluid 1020 to travel through channels that are farther away from the inner wall 2630, thereby utilizing more of the condenser 2620. In some implementations, channels of the condenser 2620 that are closer to the inner wall 2630 are smaller than channels in the condenser 2620 that are farther away from the inner wall 2630.

The process of condensing a fluid takes heat away from the evaporated fluid 1020 and into the condenser 2620. The heat from the condenser 2620 escapes out of the heat dissipating device 2600. Once the condensing fluid 1030 exits the condenser, the condensing fluid 1030 returns to (e.g., via gravity) the collection portion 460 (e.g., along the collection portion walls 2560) as the fluid 470 (e.g., condensed fluid), in liquid phase, and the cycle repeats itself.

In some implementations, as long as the evaporator 410 is being heated by an external heat source or heat generating region, the fluid 470 will cycle through the heat dissipating device 2600 in a manner as described above. In some implementations, the heat dissipating device 2600 operates optimally when the heat dissipating device 2600 is arranged such that the evaporator 410 is located lower than the condenser 2620, so as to take advantage of gravity pulling the fluid 470 towards the evaporator 410 (e.g., without the need of a pump or compressor). As mentioned above, gravity may provide the force that returns the condensed fluid to the collection portion.

Figure 27:
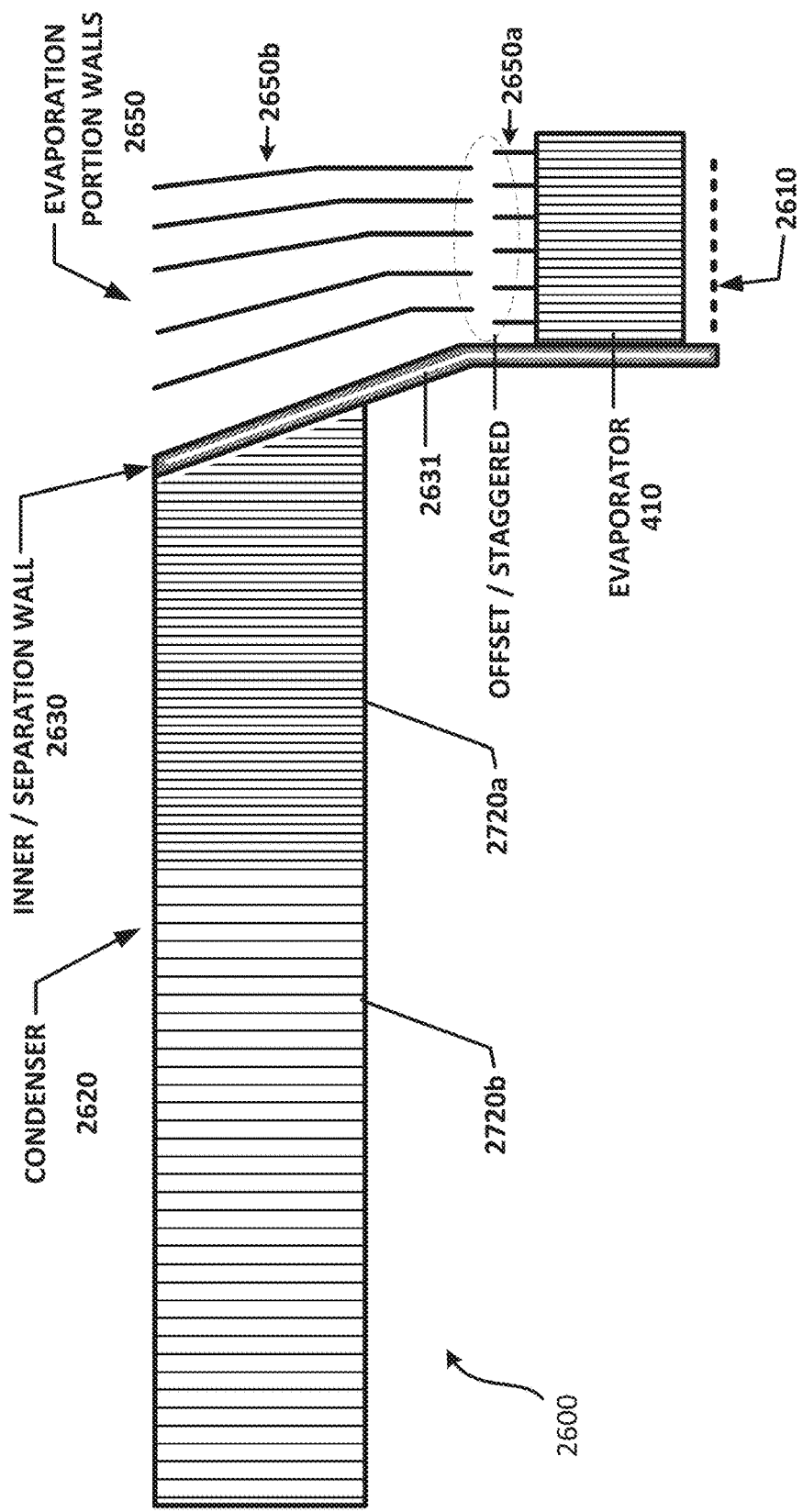
FIG. 27 illustrates a view of select components of a heat dissipating device.

FIG. 27 illustrates some components of the heat dissipating device 2600 of FIG. 26. In particular, FIG. 27 illustrates the evaporator 410, the evaporation portion walls 2650, the inner wall 2630, the condenser 2620 and the one or more barriers 2610.

In some implementations, the evaporator 410 includes a plurality of channels (e.g., channels 1310). The channels may have a width of about 500 microns ($\mu$m). The spacing between the channels may be about 150 microns ($\mu$m).

The evaporation portion walls 2650 include a first plurality of evaporation portion walls 2650a and a second plurality of evaporation portion walls 2650b. The first plurality of evaporation portion walls 2650a may be offset and/or staggered from the second plurality of evaporation portion walls 2650b. The offsetting and/or staggering of the evaporation portion walls helps break up bubbles that may be in the fluid. The first plurality of evaporation portion walls 2650a may be coupled to the evaporator 410. The second plurality of evaporation portion walls 2650b includes a portion that is straight, angled, orthogonal and/or non-orthogonal. The second plurality of evaporation portion walls 2650b may include evaporation portion walls with different angles. In some implementations, the evaporation portion walls 2650 may have a thickness of about 500 microns ($\mu$m). However, different implementations may have different values for the thickness of the evaporation portion walls 2650.

The inner wall 2630 (e.g., separation wall) may also be angled, slanted, non-orthogonal and/or include a portion that is straight, angled, slanted, orthogonal, and/or non-orthogonal. In addition, the inner wall 2630 may include a double wall. The inner wall 2630 may include the cavity 2631. The cavity 2631 may be inside the inner wall 2630. The cavity 2631 may be empty, in a vacuum, may include a low thermal conductivity material (e.g., relative to the inner wall 2630) or may include a gas (e.g., inert gas). The inner wall 2630 that includes the cavity 2631 is configured to operate as an isolation layer or isolation barrier to prevent or minimize heat from the evaporation portion 450 and/or the evaporator 410, from traveling through the inner wall 2630 and into the collection portion 460. The inner wall 2630 is also configured to prevent fluids from mixing.

The condenser 2620 includes a plurality of channels with variable widths. Different portions of the condenser 2620 may include channels with a first width, a second width, a third width, etc. . . . As shown in FIG. 27, the condenser 2620 includes a first condenser portion 2720a and a second condenser portion 2720b. The first condenser portion 2720a is closer to the inner wall 2630 than the second condenser portion 2720b. The first condenser portion 2720a includes a first plurality channels that includes a first width. The second condenser portion 2720b includes a second plurality of channels that includes a second width. The second width is different than the first width. In some implementations, the second width is greater than the first width. For example, the first condenser portion 2720a includes channels that have a width of about 450 microns ($\mu$m), and the second condenser portion 2720b includes channels that have a width of about 600 microns ($\mu$m).

In some implementations, the condenser 2620 may include other portions (e.g., third condenser portion, fourth condenser portion) with channels with different widths (e.g., third width, fourth width). In some implementations, channels that are closer to the inner wall 2630 have a smaller width than channels that are farther away from the inner wall 2630. In some implementations, the width of the channels of the condenser 2620 may progressively increases as the channels are further away from the inner wall 2630. In some implementations, the use of channels with variable widths helps direct the flow of the fluid so that more of the condenser 2620 is utilized to condensate the evaporated fluid 1020. Instead of the evaporated fluid 1020 traveling through the channels that are close to the inner wall 2630, the evaporated fluid 1020 will also travel through channels that are farther away from the inner wall 2630. Channels with larger widths provide less resistance than channels with smaller widths. As such, a fluid may travel through these high width channels, despite the fact that these larger width channels are farther away from the inner wall 2630. In some implementations, the channels may be wider in the middle of the condenser 2620 relative to the channels near the end of the condenser 2620. However, different implementations may use different combinations of widths and/or spacing for the channels in the condenser 2620.

The one or more barriers 2610 are located near the evaporator 410. In some implementations, the one or more barriers 2610 are located in the collection portion 460. The spacing between the barriers 2610 may be about 500 microns ($\mu$m). However, different implementations may have different values for the spacing of the barriers.

It is noted that the dimensions, sizes, shapes described above are merely exemplary, and different implementations may use different dimensions, sizes and shapes. For example, the ratio between the number of channels for the evaporator 410 and the number of evaporation portion walls 2650 may vary with different implementations. In some implementations, there are five (5) channels in the evaporator 410 between two neighboring evaporation portion walls (e.g., 2650) Similarly, the ratio between the number of channels for the condenser 2620 and the number of collection portion walls 2560 may vary with different implementations. In some implementations, there are (4) channels in the condenser 2620 between two neighboring collection portion walls (e.g., 2560). The overall dimensions of the heat dissipating device 2600 may be similar to the dimensions of other heat dissipating devices described in the disclosure.

Figure 28:
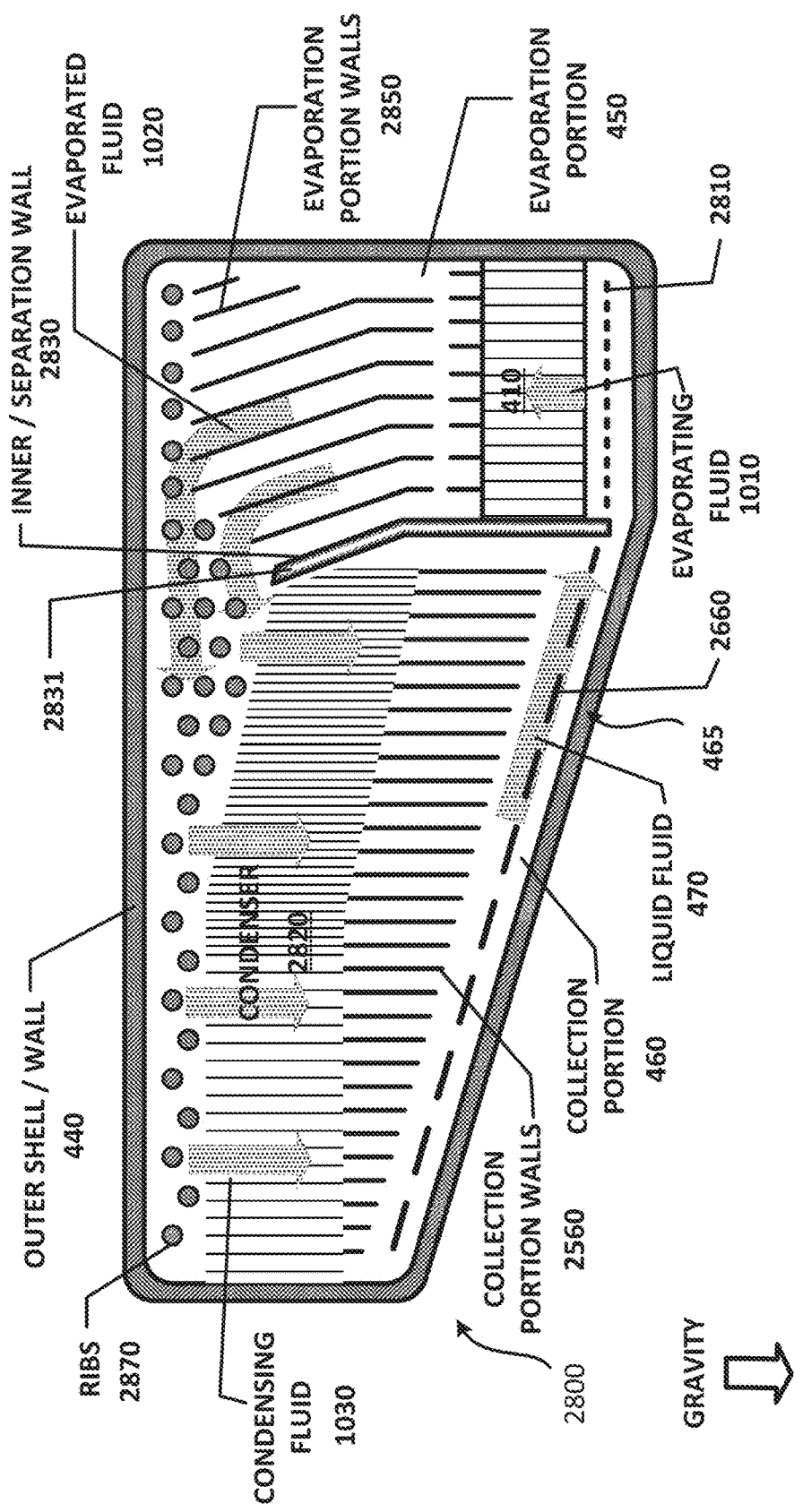
FIG. 28 illustrates a view of a heat dissipating device comprising ribs, separation walls, and walls for providing structural support.

FIG. 28 illustrates an example of a heat dissipating device 2800 with improved heat dissipating capabilities. The heat dissipating device 2800 includes components and/or structure that are configured to provide structural support for the heat dissipating device, reduce fluid pressure drops in the device, break and prevent bubbles from entering into particular component(s), provide improved fluid flow, provide better heat isolation between different areas of the device, and improve overall utilization of the space in the device. The heat dissipating device 2800 is similar to the heat dissipating devices 400, 2500 and 2600, and thus includes similar components as the heat dissipating devices 400, 2500 and 2600. The heat dissipating device 2800 includes components and structures that are arranged differently than what is described in other parts of the disclosure. However, different implementations may use different combinations of the features described in the disclosure.

In some implementations, the heat dissipating device 2800 may be configured to dissipate about 10 Watts or more of heat. (e.g., between about 10-13 Watts of heat). In some implementations, the heat dissipating device 2800 may be configured to operate at high pressures (e.g., about 6 bars or greater).

The heat dissipating device 2800 includes one or more barriers 2810, one or more evaporation portion walls 2850, an inner wall 2830 (e.g., separation wall), one or more support walls 2660, one or more collection portion walls 2560, a plurality of ribs 2870, and a condenser 2820 that includes variable width channels.

The fluid (e.g., evaporated fluid 1020) may travel along or through the one or more evaporation portion walls 2850 and a plurality of ribs 2870. The fluid (e.g., fluid 470) may travel through the condenser 2820 and along or through the one or more collection portion walls 2560. The heat dissipating device 2800 operates in a similar manner as the heat dissipating device 400, the heat dissipating device 2500 and/or the heat dissipating device 2600, but can operate with improved heat dissipating capabilities.

The one or more evaporation portion walls 2850 are configured to provide lower fluid pressure drops through the evaporation portion 450, which improves fluid flow and thus provide better heat dissipating capabilities. The reduction in fluid pressure drops is achieved by providing angled or slanted walls (e.g., relative to the other walls of the heat dissipating device 2800) for the evaporation portion walls 2850. In some implementations, the evaporation portion walls 2850 are non-orthogonal evaporation portion walls 2850. In some implementations, the one or more evaporation portion walls 2850 includes portions that are straight, angled, slanted, orthogonal, non-orthogonal, offset and/or staggered. In some implementations, the use of offset and/or staggered evaporation portion walls 2850 helps break up bubbles that may travel through the evaporation portion 450. Breaking up the bubbles and/or reducing the bubbles helps improve the flow of the evaporated fluid 1020, which increases the heat dissipating capabilities of the heat dissipating device 2800. The one or more evaporation portion walls 2850 are further described in FIG. 29.

The inner wall 2830 (e.g., separation wall) may also be angled, slanted, non-orthogonal and/or include a portion that is straight, angled, slanted, orthogonal, and/or non-orthogonal. In addition, the inner wall 2830 may include a double wall. The inner wall 2830 may include a cavity 2831. The cavity 2831 may be inside the inner wall 2830. The cavity 2831 may be empty, in a vacuum, may include a low thermal conductivity material (e.g., relative to the inner wall 2830) or may include a gas (e.g., inert gas). The inner wall 2830 that includes the cavity 2831 is configured to operate as an isolation layer or isolation barrier to prevent or minimize heat from the evaporation portion 450 and/or the evaporator 410, from traveling through the inner wall 2830 and into the collection portion 460. The inner wall 2830 is also configured to prevent fluids from mixing. The inner wall 2830 is positioned further away to the left than the inner wall 2630 (as shown in FIG. 26). In some implementations, this is done so that heat coming through the evaporator 410 does not affect as much the condenser 2820 and/or the collection portion 460.

The heat dissipating device 2800 includes more ribs 2870 than the heat dissipating device 2600. In some implementations, the additional ribs 2870 help the heat dissipating device 2800 operate at a higher pressure than other heat dissipating devices. It is noted that the number and configuration of the ribs (e.g., ribs 2870) in the present disclosure, are exemplary, and different implementations may use different numbers and configurations of the ribs (e.g., ribs 2870). The condenser 2820 includes a plurality of channels with variable widths. Different portions of the condenser 2820 may include channels with a first width, a second width, a third width, etc. . . . In some implementations, channels that are closer to the inner wall 2830 have a smaller width than channels that are farther away from the inner wall 2830. In some implementations, the use of channels with variable widths helps direct the flow of the fluid so that more of the condenser 2820 is utilized to condensate the fluid. Instead of the evaporated fluid 1020 traveling through the channels that are close to the inner wall 2830, the evaporated fluid 1020 will also travel through channels that are farther away from the inner wall 2830. Moreover, as shown in FIG. 28, portions of the condenser 2820 are angled and/or slanted so that the evaporated fluid 1020 can flow better into the channels of the condenser 2820. In addition, some portions of the condenser 2820 may be straight, angled, slanted, curved, orthogonal and/or non-orthogonal to the outer wall or shell. Examples of channels (e.g., 1320) are described in FIGS. 13-18. The condenser 2820 that includes channels with variable widths is further described in FIG. 29.

The one or more support walls 2660 are configured to provide additional coupling between the first shell 500 and the second shell 510 of the outer shell 440, and thus provides additional structure support to withstand high internal pressure. The one or more support walls 2660 are located in the collection portion 460 near the collection portion walls 2560 and an angled portion (e.g., 465). The one or more support walls 2660 may be configured to break and/or reduce bubbles in the collection portion 460. Breaking up the bubbles and/or reducing the bubbles helps improve the flow of the fluid 470, which increases the heat dissipating capabilities of the heat dissipating device 2800. Different implementations may include support walls 2660 with different shapes and/or sizes. For example, the support walls 2660 may have similar shapes and/or sizes as the barriers 2810.

The one or more barriers 2810 are located near the evaporator 410. The barriers 2810 may be a means for bubble breaking. There is spacing between the one or more barriers 2810 that allows the fluid 470 to travel through. The one or more barriers 2810 are configured to prevent bubbles from entering the evaporator 410 and/or breaking bubbles in the fluid 470 before the fluid 470 enters the evaporator 410. Different implementations may use barriers 2810 with different sizes and shapes. For example, some implementations, barriers 2810 may have shapes that include edges, which help break up the bubbles. For example, the barriers 2810 may include a diamond shape, a square shape, a rectangular shape, an octagon shape, etc. . . . In some implementations, the one or more barriers 2810 may be walls. The one or more barriers 2810 may be configured to break and/or reduce bubbles from the collection portion 460. Breaking up the bubbles and/or reducing the bubbles helps improve the flow of the fluid 470 into the evaporator 410, which increases the heat dissipating capabilities of the heat dissipating device 2800. A detailed example of a barrier is further described in FIG. 29.

In some implementations, the one or more evaporation portion walls 2850, the one or more collection portion walls 2560, the plurality of ribs 2870, the one or more barriers 2810, and/or the one or more support walls 2660 are configured to provide additional coupling between the first shell 500 and the second shell 510 of the outer shell 440, thus provide additional structural support to withstand high internal pressures. In some implementations, the one or more evaporation portion walls 2850, the one or more collection portion walls 2560, the plurality of ribs 2870, the one or more barriers 2810, and/or the one or more support walls 2660 provide a heat dissipating device 2800 that can withstand about 6 bars or more, of internal pressure inside the heat dissipating device 2800.

FIG. 28 also illustrates that the evaporation portion walls 2850 subdivide the evaporation portion 450, and the collection portion walls 2560 subdivide the collection portion 460. In some implementations, the flow of the fluid inside the heat dissipating device 2800 is similar to the flow of the fluid inside the heat dissipating device 2600. The heat dissipating device 2800 may be a cooling device that provides heat dissipation through recirculation of a fluid in the outer shell 440 without the need of a pump or compressor.

FIG. 28 illustrates the fluid 470 in the collection portion 460 of the heat dissipating device 2800. The collection portion 460 includes the collection portion walls 2560. The collection portion 460 has an angled portion (e.g., 465) so that the fluid 470 (which is in liquid form) flows down (e.g., due to gravity) towards the evaporator 410. In some implementations, before entering the evaporator 410, the fluid 470 travels through one or more barriers 2810, which may break up bubbles in the fluid 470 or prevent bubbles in the fluid 470 from entering the evaporator 410. The evaporator 410 is being heated by a heat generating region (e.g., region comprising a TIM and/or an integrated device). The evaporator 410 in FIG. 28 is larger than the evaporator 410 of FIG. 26. FIG. 28 also illustrates that the condenser 2820 is smaller than the condenser 2620 of FIG. 26. However, different implementations may use evaporators and condensers with different shapes and/or sizes. In some implementations, the entrance and/or walls of the channels of the evaporator 410 may include edges (e.g., V shape edges) so as to help break up bubbles in the fluid entering the evaporator 410.

As the fluid 470 enters the evaporator 410 and travels through the evaporator 410, the fluid 470 becomes an evaporating fluid 1010 due to the heat from the evaporator 410. In some implementations, one or more channels of the evaporator 410 may include one or more posts. Examples of posts in the evaporator 410 are further described in FIG. 29. Once the evaporating fluid 1010 exits the evaporator 410, the evaporating fluid 1010 becomes an evaporated fluid 1020 (e.g., vapor fluid) that travels through the evaporation portion 450 (e.g., along the evaporation portion walls 2850 and/or ribs 2870) towards the condenser 2820. The evaporation portion walls 2850 are offset or staggered, which helps break up bubbles in the evaporated fluid 1020. The evaporation portion walls 2850 are angled in such a way as to reduce the pressure drop of the evaporated fluid 1020 as it travels through the evaporation portion 450. The angled portions of the walls 2850 reduces, minimizes and/or eliminates right angles in the heat dissipating device 2800, and thus help the evaporated fluid 1020 flow more efficiently. The evaporated fluid 1020 may include fluid in a gas phase and some fluid in liquid phase.

As the evaporated fluid 1020 (e.g., vapor fluid) enters the condenser 2820 and travels through the condenser 2820, the evaporated fluid 1020 becomes a condensing fluid 1030. The different widths (e.g., variable widths) of the channels of the condenser 2820 help direct some of evaporated fluid 1020 to travel through channels that are farther away from the inner wall 2830, thereby utilizing more of the condenser 2820. In some implementations, channels of the condenser 2820 that are closer to the inner wall 2830 are smaller than channels in the condenser 2820 that are farther away from the inner wall 2830.

The process of condensing a fluid takes heat away from the evaporated fluid 1020 and into the condenser 2820. The heat from the condenser 2820 escapes out of the heat dissipating device 2800. Once the condensing fluid 1030 exits the condenser, the condensing fluid 1030 returns to (e.g., via gravity) the collection portion 460 (e.g., along the collection portion walls 2560) as the fluid 470 (e.g., condensed fluid), in liquid phase, and the cycle repeats itself.

In some implementations, as long as the evaporator 410 is being heated by an external heat source or heat generating region, the fluid 470 will cycle through the heat dissipating device 2800 in a manner as described above. In some implementations, the heat dissipating device 2800 operates optimally when the heat dissipating device 2800 is arranged such that the evaporator 410 is located lower than the condenser 2820, so as to take advantage of gravity pulling the fluid 470 towards the evaporator 410 (e.g., without the need of a pump or compressor). As mentioned above, gravity may provide the force that returns the condensed fluid to the collection portion.

Figure 29:
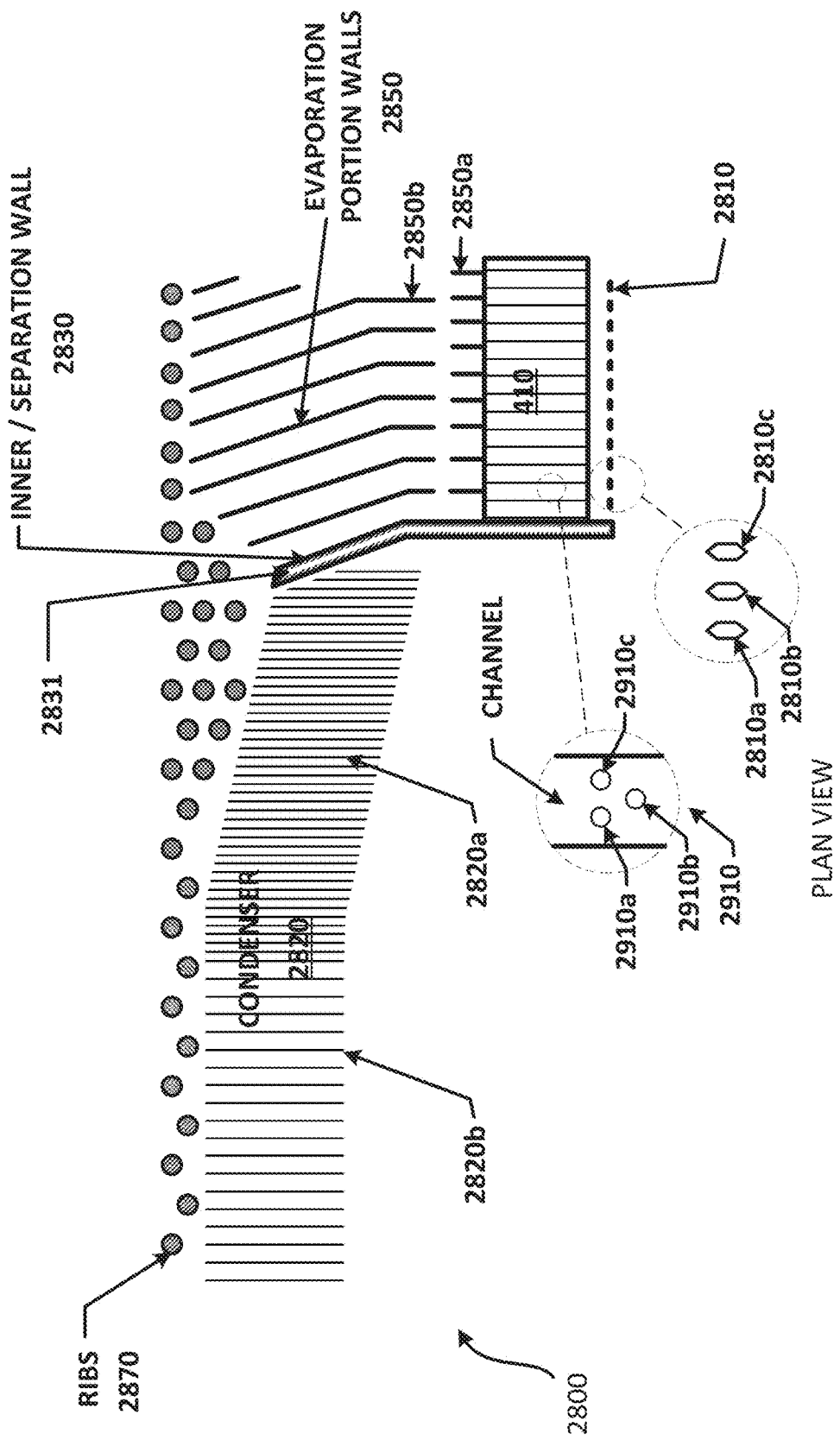
FIG. 29 illustrates a view of select components of a heat dissipating device.

FIG. 29 illustrates some components of the heat dissipating device 2800 of FIG. 28. In particular, FIG. 29 illustrates the evaporator 410, the evaporation portion walls 2850, the inner wall 2830, the cavity 2831, the condenser 2820 and the one or more barriers 2810.

In some implementations, the evaporator 410 includes a plurality of channels (e.g., channels 1310). The channels may have a width of about 500 microns (μm). The spacing between the channels may be about 150 microns (μm). The evaporator 410 may also include posts 2910 (e.g., 2910a, 2910b, 2910c). These posts 2910 may be located inside the channels of the evaporator 410. These posts 2910 may help break up the bubbles that may be in the fluid. Different implementations may have different numbers and configurations of posts 2910. In some implementations, the posts 2910 may have a circular cross-sectional profile so as to minimize its effect on the flow of the fluid that travels through the channels of the evaporator 410.

The evaporation portion walls 2850 include a first plurality of evaporation portion walls 2850a and a second plurality of evaporation portion walls 2850b. The first plurality of evaporation portion walls 2850a may be offset and/or staggered from the second plurality of evaporation portion walls 2850b. The offsetting and/or staggering of the evaporation portion walls helps break up bubbles that may be in the fluid. The first plurality of evaporation portion walls 2850a may be coupled to the evaporator 410. The second plurality of evaporation portion walls 2850b includes a portion that is straight, angled, curved, orthogonal and/or non-orthogonal. The second plurality of evaporation portion walls 2850b may include evaporation portion walls with different angles. In some implementations, the evaporation portion walls 2850 may have a thickness of about 500 microns (μm). However, different implementations may have different values for the thickness of the evaporation portion walls 2850.

The inner wall 2830 (e.g., separation wall) may also be angled, slanted, non-orthogonal and/or include a portion that is straight, angled, slanted, orthogonal, and/or non-orthogonal. In addition, the inner wall 2830 may include a double wall. The inner wall 2830 may include the cavity 2831. The cavity 2831 may be inside the inner wall 2830. The cavity 2831 may be empty, in a vacuum, may include a low thermal conductivity material (e.g., relative to the inner wall 2830) or may include a gas (e.g., inert gas). The inner wall 2830 that includes the cavity 2831 is configured to operate as an isolation layer or isolation barrier to prevent or minimize heat from the evaporation portion 450 and/or the evaporator 410, from traveling through the inner wall 2830 and into the collection portion 460. The inner wall 2830 is also configured to prevent fluids from mixing.

The condenser 2820 includes a plurality of channels with variable widths. Different portions of the condenser 2820 may include channels with a first width, a second width, a third width, etc. . . . As shown in FIG. 29, the condenser 2820 includes a first condenser portion 2820*a* and a second condenser portion 2820*b*. The first condenser portion 2820*a* is closer to the inner wall 2830 than the second condenser portion 2820*b*. The first condenser portion 2820*a* includes angled portions, which facilitate the flow of the fluid insider the channels. The first condenser portion 2820*a* includes a first plurality channels that includes a first width. The second condenser portion 2820*b* includes a second plurality of channels that includes a second width. The second width is different than the first width. In some implementations, the second width is greater than the first width. For example, the first condenser portion 2820*a* includes channels that have a width of about 450 microns (μm), and the second condenser portion 2820*b* includes channels that have a width of about 600 microns (μm).

In some implementations, the condenser 2820 may include other portions (e.g., third condenser portion, fourth condenser portion) with channels with different widths (e.g., third width, fourth width). In some implementations, channels that are closer to the inner wall 2830 have a smaller width than channels that are farther away from the inner wall 2830. In some implementations, the width of the channels of the condenser 2820 may progressively increases as the channels are further away from the inner wall 2830. In some implementations, the use of channels with variable widths helps direct the flow of the fluid so that more of the condenser 2820 is utilized to condensate the evaporated fluid 1020. Instead of the evaporated fluid 1020 traveling through the channels that are close to the inner wall 2830, the evaporated fluid 1020 will also travel through channels that are farther away from the inner wall 2830. Channels with larger widths provide less resistance than channels with smaller widths. As such, a fluid may travel through these high width channels, despite the fact that these larger width channels are farther away from the inner wall 2830. In some implementations, the channels may be wider in the middle of the condenser 2820 relative to the channels near the end of the condenser 2820. However, different implementations may use different combinations of widths and/or spacing for the channels in the condenser 2820. In some implementations, the above examples provide a condenser that more uniformly condenses the fluid, and thus more efficiently condenses the fluid.

The one or more barriers 2810 are located near the evaporator 410. In some implementations, the one or more barriers 2810 are located in the collection portion 460. Different implementations may have different values for the spacing of the barriers. Different implementations may use barriers 2810 with different shapes. Examples of shapes for the barriers 2810 include diamond, square, rectangle and octagon. In some implementations, the barriers 2810 have one or more edges to help break bubbles. As shown in FIG. 29, the barriers 2810 include barriers 2810*a*, 2810*a* and 2810*c* that have a diamond shape.

It is noted that the dimensions, sizes, shapes described above are merely exemplary, and different implementations may use different dimensions, sizes and shapes. For example, the ratio between the number of channels for the evaporator 410 and the number of evaporation portion walls 2850 may vary with different implementations. In some implementations, there are five (5) channels in the evaporator 410 between two neighboring evaporation portion walls (e.g., 2850) Similarly, the ratio between the number of channels for the condenser 2820 and the number of collection portion walls 2560 may vary with different implementations. In some implementations, there are (4) channels in the condenser 2820 between two neighboring collection portion walls (e.g., 2560). The overall dimensions of the heat dissipating device 2800 may be similar to the dimensions of other heat dissipating devices described in the disclosure. It is noted that the heat dissipating devices (e.g., 2500, 2600, 2800) may be modified to include other features, including features described in the present disclosure. It is also noted that the heat dissipating devices (e.g., 2500, 2600, 2800) may be implemented and integrated in a device (e.g., electronic device) differently.

Exemplary Method for Fabricating a Heat Dissipating Device

Figure 30:
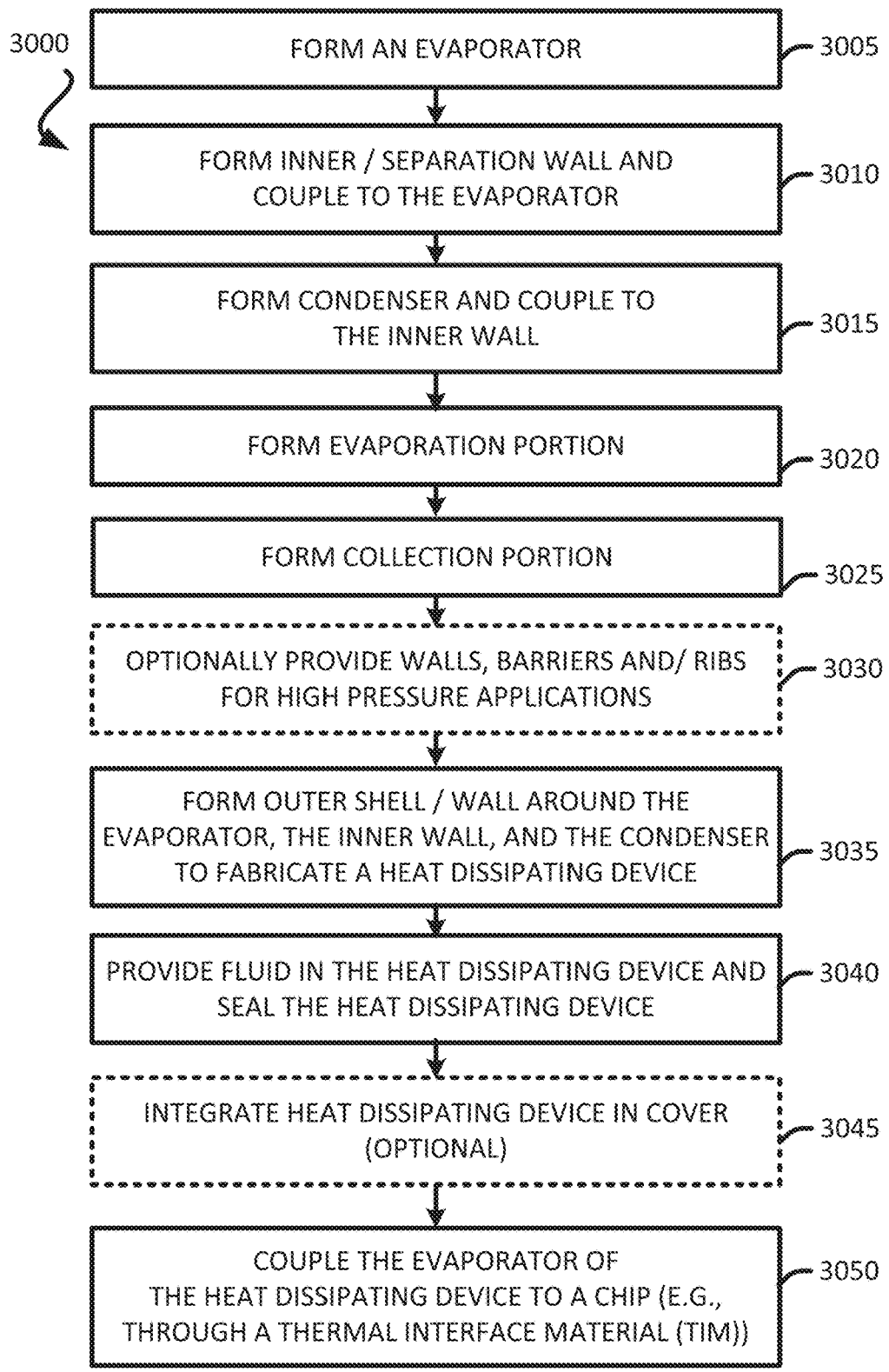
FIG. 30 illustrates an exemplary flow diagram of a method for fabricating a heat dissipating device.

FIG. 30 illustrates a flow chart of an exemplary method 3000 for fabricating a heat dissipating device and coupling the heat dissipating device to a device (e.g., mobile device). The method of FIG. 30 may be used to fabricate any of the heat dissipating devices described in the present disclosure. It is noted the order of the method may be changed and/or modified. In some implementations, some of the processes may be formed concurrently. In some implementations, all of the components described below may be formed from one part and/or material.

The method 3000 for fabricating the heat dissipating device may be performed before, concurrently, or after the device (e.g., mobile) is assembled. For example, the device (e.g., mobile device) may be assembled to include a region, an integrated device may be provided in the region of the device, and the heat dissipating device may be fabricated and coupled to the region that includes the integrated device.

As shown in FIG. 30, the method forms (at 3005) an evaporator (e.g., evaporator 410). The evaporator may include channels and/or posts. An example of forming an evaporator is illustrated in FIGS. 19A-19B.

The method forms (at 3010) an inner wall (e.g., inner wall 430) and couples the inner wall to the evaporator. The inner wall may include a double wall and/or a cavity (e.g., 2361). The inner cavity may be empty, include a material different than the inner wall, a gas (e.g., inert gas) or in a vacuum.

The method forms (at 3015) a condenser (e.g., condenser 420) and couples the condenser to the inner wall. An example of forming a condenser is illustrated in FIGS. 19A-19B. In some implementations, the evaporator, the inner wall, and/or the condenser are formed concurrently to form a unibody component.

The method forms (at 3020) an evaporation portion (e.g., evaporation portion 450). In some implementations, the evaporation portion is formed when an outer shell is formed.

The method forms (at 3025) a collection portion (e.g., collection portion 460). In some implementations, the collection portion is formed when an outer shell is formed.

The method optionally forms (at 3030) ribs (e.g., 2570), barriers (e.g., 2610) and/or walls (e.g., 2550, 2560) for high pressure application. These walls, barriers and/or ribs provide additional structural support for the heat dissipating device in high pressure applications (e.g., 6 bars or greater). These walls, barriers and/or ribs may also provide improve fluid flow in the heat dissipating device. The barriers may be offset and/or staggered. Examples of walls, barriers and/or ribs used in high pressure applications are described and illustrated in FIGS. 25-26.

The method forms (at 3035) an outer shell (e.g., outer shell 440) around the evaporator, the inner wall, the condenser to fabricate a heat dissipating device. In some implementations, forming the outer shell also includes forming the evaporation portion, the collection portion, the walls and/or ribs. An example of forming the outer shell is described and illustrated in FIG. 6.

The method provides (at 3040) a fluid (e.g., fluid 470) in the heat dissipating device. In some implementations, the fluid is provided through a small cavity in the outer shell, and the small cavity is subsequently sealed.

The method optionally integrates (at 3045) the heat dissipating device in a cover. Examples of a cover that includes a heat dissipating device are described and illustrated in FIGS. 20-24.

The method couples (at 3050) the heat dissipating device to an integrated device (e.g., chip, die, package) in a device (e.g., mobile device). In some implementations, the heat dissipating device is coupled to the integrated device through a thermal interface material (TIM). In some implementations, the heat dissipating device is coupled to a heat generating region of a device (e.g., through a TIM). In some implementations, when the heat dissipating device is implemented in a cover, the cover comprising the heat dissipating device is coupled to the device comprising the integrated device.

Exemplary Electronic Devices

Figure 31:
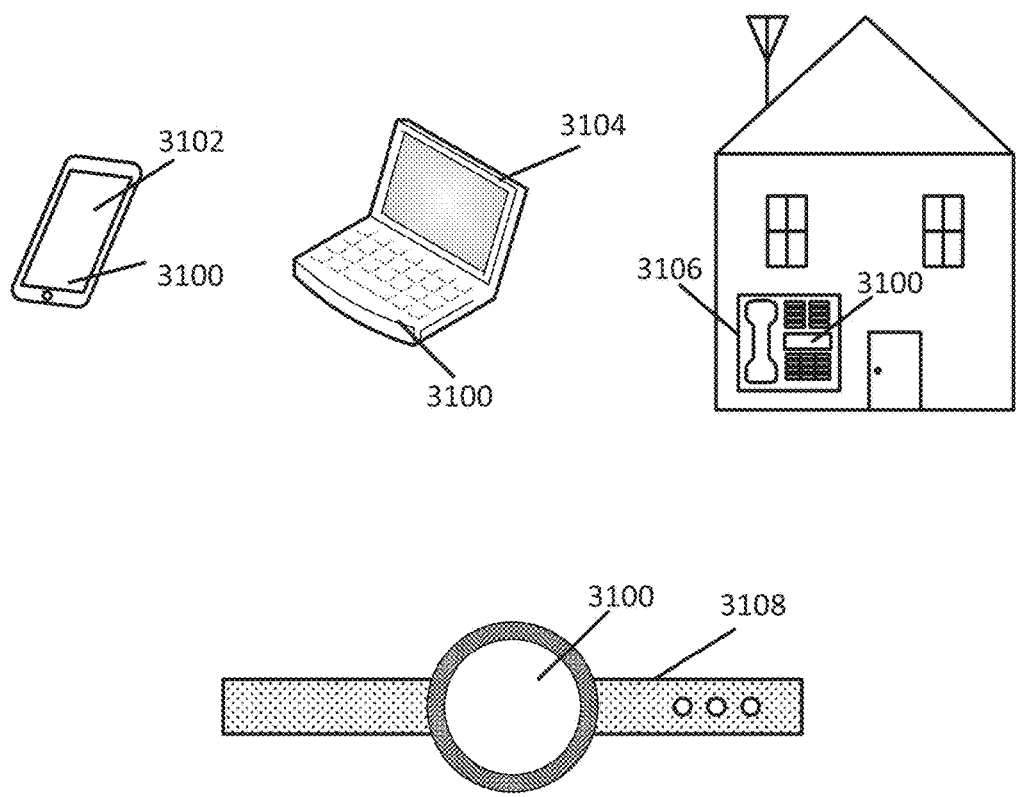
FIG. 31 illustrates various electronic devices that may integrate a semiconductor device, an integrated device, a die, an integrated circuit, a PCB and/or a multi-layer heat spreader described herein.

FIG. 31 illustrates various electronic devices that may be integrated with any of the aforementioned heat dissipating device, integrated device, semiconductor device, integrated circuit, die, interposer, package or package-on-package (PoP). For example, a mobile phone device 3102, a laptop computer device 3104, a fixed location terminal device 3106, a wearable device 3108 may include an integrated device 3100 and/or heat dissipating device, as described herein. The integrated device 3100 may be, for example, any of the integrated circuits, dies, integrated devices, integrated device packages, integrated circuit devices, device packages, integrated circuit (IC) packages, package-on-package devices described herein. The devices 3102, 3104, 3106, 3108 illustrated in FIG. 31 are merely exemplary. Other electronic devices may also feature the integrated device 3100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 4, 5, 6, 7, 8, 9, 10, 11, 12, 13, 14, 15, 16, 17, 18, 19A-19B, 20, 21, 21, 22, 23, 24, 25, 26, 27, 28, 29, 30 and/or 31 may be rearranged and/or combined into a single component, process, feature or function or embodied in several components, processes, or functions. Additional elements, components, processes, and/or functions may also be added without departing from the disclosure. It should also be noted that FIGS. 4, 5, 6, 7, 8, 9, 10, 11, 12, 13, 14, 15, 16, 17, 18, 19A-19B, 20, 21, 21, 22, 23, 24, 25, 26, 27, 28, 29, 30 and/or 31 and its corresponding description in the present disclosure is not limited to dies and/or ICs. In some implementations, FIGS. 4, 5, 6, 7, 8, 9, 10, 11, 12, 13, 14, 15, 16, 17, 18, 19A-19B, 20, 21, 21, 22, 23, 24, 25, 26, 27, 28, 29, 30 and/or 31 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
    a region comprising an integrated device; and
    a heat dissipating device coupled to the region comprising the integrated device, the heat dissipating device configured to dissipate heat away from the region, wherein the heat dissipating device comprises:
        a fluid;
        an evaporator configured to evaporate the fluid;
        a condenser configured to condense the fluid$_2$
        wherein the condenser comprises a plurality of variable width channels, the plurality of variable width channels comprising a first channel having a first width and a second channel having a second width, the second width being greater than the first width, and wherein the plurality of variable width channels is aligned in such a direction that a length of the plurality of variable width channels is not directed towards the evaporator;

an inner wall coupled to the evaporator and the condenser, wherein the inner wall is configured to separate the evaporator from the condenser and prevent fluid leaving the evaporator from mixing with fluid leaving the condenser, and wherein the inner wall is boated closer to the first channel of the condenser than the second channel of the condenser;

an outer shell encapsulating the fluid, the evaporator, the condenser and the inner wall;

an evaporation portion configured to channel the fluid from the evaporator to the condenser, wherein the evaporation portion is at least partially defined by the inner wall;

a plurality of evaporation portion walls in the evaporation portion, at least one evaporation portion wall comprising a non-orthogonal portion; and a collection portion configured to channel the fluid from the condenser to the evaporator, wherein the collection portion is at least partially defined by the inner wall.

2. The device of claim 1, wherein the collection portion comprises at least one non-orthogonal angled portion, the at least one non-orthogonal angled portion configured to direct, with the help of gravity, the fluid towards the evaporator.

3. The device of claim 1, wherein the region further comprises a thermal interface material (TIM) coupled to the integrated device and the heat dissipating device.

4. The device of claim 3, wherein the thermal interface material (TIM) is coupled to a portion of the outer shell that is over the evaporator.

5. The device of claim 1, wherein the evaporator comprises a plurality of channels configured to allow the fluid to pass through the evaporator such that the fluid pressure drop across the evaporator is about 0.0049 bar or less.

6. The device of claim 1, wherein the second channel of the condenser-has a second width that is greater than the first width so that the condenser is configured to direct fluid to travel through channels that are farther away from the inner wall.

7. The device of claim 1, wherein the heat dissipating device further comprises a plurality of barriers, a plurality of ribs and a plurality of walls in the evaporation portion and the collection portion.

8. The device of claim 1, wherein the inner wall is a double wall that includes a cavity comprising an inert gas.

9. The device of claim 1, wherein the inner wall includes a non-orthogonal portion.

10. The device of claim 1, wherein the integrated device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

11. The device of claim 1, wherein the fluid leaving the evaporator includes gas and the fluid leaving the condenser includes liquid.

12. The device of claim 1, wherein the evaporator is configured to channel the fluid in a first direction, and the condenser is configured to channel the fluid in a second direction, wherein the first direction is different than the second direction.

13. The device of claim 1, wherein the condenser includes a first longest side and the device includes a first longest edge, wherein the first longest side of the condenser is parallel to the first longest edge of the device.

14. The device of claim 1, wherein the condenser and the evaporator are displaced relative to each other and not in the same line.

15. An apparatus comprising:

a region comprising an integrated device; and a heat dissipating means coupled to the region comprising the integrated device, the heat dissipating means is configured to dissipate heat away from the region, wherein the heat dissipating means comprises:

a fluid;

a means for evaporating configured to evaporate the fluid;

a means for condensing configured to condense the fluid, wherein the means for condensing comprises a plurality of variable width channels, the plurality of variable width channels comprising a first channel having a first width and a second channel having a second width, the second width being greater than the first width;

an inner wall coupled to the means for evaporating and the means for condensing, wherein the inner wall is a double wall that includes a cavity, wherein the inner wall is located closer to the first channel of the means for condensing than the second channel of the means for condensing, wherein the inner wall is configured to separate the means for evaporating from the means for condensing and prevent fluid leaving from the means for evaporating from mixing with fluid leaving from the means for condensing, wherein the inner wall is positioned such that the means for evaporating is located on a first side of the inner wall, and the means for condensing is located on a second side of the inner wall;

an outer shell encapsulating the fluid, the means for evaporating, the means for condensing and the inner wall;

an evaporation portion configured to channel the fluid from the means for evaporating to the means for condensing, wherein the evaporation portion is at least partially defined by the inner wall;

a plurality of evaporation portion walls in the evaporation portion, at least one evaporation portion wall comprising a non-orthogonal portion; and a collection portion configured to channel the fluid from the means for condensing to the means for evaporating, wherein the collection portion is at least partially defined by the inner wall.

16. The apparatus of claim 15, wherein the collection portion comprises at least one non-orthogonal angled portion, the at least one non-orthogonal angled portion configured to direct, with the help of gravity, the fluid towards the means for evaporating.

17. The apparatus of claim 15, wherein the region further comprises a thermal interface material (TIM) coupled to the integrated device and the heat dissipating means.

18. The apparatus of claim 17, wherein the thermal interface material (TIM) is coupled to a portion of the outer shell that is over the means for evaporating.

19. The apparatus of claim 15, wherein the means for evaporating comprises a plurality of channels configured to allow the fluid to pass through the means for evaporating such that the fluid pressure drop across the means for evaporating is about 0.0049 bar or less.

20. The apparatus of claim 15, wherein the means for condensing is configured to direct fluid to travel through channels that are located farther away from the inner wall.

21. The apparatus of claim 15, wherein the heat dissipating device further comprises a plurality of barriers, a plurality of ribs and a plurality of walls in the evaporation portion and the collection portion.

22. The apparatus of claim 15, wherein the cavity in the inner wall is empty.

23. The apparatus of claim 15, wherein the inner wall includes a non-orthogonal portion.

24. The apparatus of claim 15, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

* * * * *